(12) United States Patent
Ito et al.

(10) Patent No.: US 7,872,353 B2
(45) Date of Patent: Jan. 18, 2011

(54) SEMICONDUCTOR DEVICE

(75) Inventors: Sachiyo Ito, Yokohama (JP); Masahiko Hasunuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 591 days.

(21) Appl. No.: 11/964,336

(22) Filed: Dec. 26, 2007

(65) Prior Publication Data

US 2008/0164614 A1    Jul. 10, 2008

(30) Foreign Application Priority Data

Dec. 27, 2006  (JP)  .............................. 2006-352998

(51) Int. Cl.
*H01L 23/52* (2006.01)

(52) U.S. Cl. ............... 257/758; 257/760; 257/E23.141; 257/774; 257/211

(58) Field of Classification Search ................ 257/621, 257/752, 758, 760, 774, E21.627, E21.641, 257/E21.575–E21.597, E51.019, E51.021, 257/E23.141

See application file for complete search history.

(56) References Cited

U.S. PATENT DOCUMENTS 6,958,542 B2  10/2005  Hasunuma et al.
7,180,192 B2   2/2007  Hasunuma et al.
7,285,859 B2  10/2007  Hasunuma et al.
2002/0047207 A1*  4/2002  Sekiguchi .................... 257/758
2005/0167842 A1*  8/2005  Nakamura et al. .......... 257/758
2006/0145347 A1*  7/2006  Aida ........................... 257/758
2007/0204243 A1   8/2007  Ito et al.

FOREIGN PATENT DOCUMENTS

JP         2005-150389         6/2005

* cited by examiner

*Primary Examiner*—Fernando L Toledo
*Assistant Examiner*—Mamadou Diallo
(74) *Attorney, Agent, or Firm*—Finnegan, Henderson, Farabow, Garrett & Dunner, L.L.P.

(57) ABSTRACT

A semiconductor device including at least two layers of interlayer-insulator-films stacked above a substrate and at least partially formed by a low-relative-dielectric-constant-film having a relative-dielectric-constant of 3.4 or less respectively, a plurality of wirings provided at least one within each of the interlayer-insulator-film and at least partially located within the low-relative-dielectric-constant-films, a plurality of plugs provided at least one within each of the interlayer-insulator-film and connected to a lower part of the wirings, and a plurality of reinforcement members provided at least one within each of the interlayer-insulator-film with being separated from the wirings at a predetermined interval, electrically cut from the wirings and the plugs, and at least partially located within the low-relative-dielectric-constant-films, and wherein, the interlayer-insulator-films, the wirings, the plugs, and the reinforcement members satisfy a predetermined relation for each of the interlayer-insulator-film.

20 Claims, 4 Drawing Sheets

10(19,37)

10(19,37)

10(19,37)

10(19,37)

10(19,37)

ns to be installed in an interlayer-insulator-film formed by stacking a plurality of insulator films including a low-relative-dielectric-constant-film.
SEMICONDUCTOR DEVICE

CROSS-REFERENCE TO RELATED APPLICATIONS

This application is based upon and claims the benefit of priority from prior Japanese Patent Application No. 2006-352998, filed Dec. 27, 2006, the entire contents of which are incorporated herein by reference.

BACKGROUND OF THE INVENTION

1. Field of the Invention

The present invention relates to an art for improving a quality and a reliability of a semiconductor device, and particularly, the present invention relates to an art for improving a quality and a reliability of a semiconductor device by improving a decay durability in the vicinity of a wiring to be installed in an interlayer-insulator-film formed by stacking a plurality of insulator films including a low-relative-dielectric-constant-film.

2. Description of the Related Art

In recent years, for speed-up of a semiconductor device including an LSI, lowering of wiring resistance and lowering of relative dielectric constant of an interlayer-insulator-film or the like have been promoted. Specifically, a material of wiring is changed from aluminum (Al) into copper (Cu). In addition, as an interlayer-insulator-film, a low-relative-dielectric-constant-film (a low-k film) is also changed from a simple $SiO_2$ film into a $SiO_2$ film having fluorine doped thereon, and a $SiO_2$ film containing an organic constituent.

The low-relative-dielectric-constant-film is formed by lowering a density of a material or eliminating a polarity of the material or the like. For example, in order to lower the density of the material, generally, the material is made porous. Thus, since the low-relative-dielectric-constant-film has a low film density, generally, the low-relative-dielectric-constant-film has a low mechanical property value such as a Young's modulus or the like. In other words, the low-relative-dielectric-constant-film has a low strength of the material itself. In addition, the low-relative-dielectric-constant-film has a film structure with low polarity for lowering the dielectric constant in the film. Therefore, an adhesive strength on a stacking boundary face in a stacked insulator film formed by stacking the low-relative-dielectric-constant-film with each other or stacking the low-relative-dielectric-constant-film and other film is low. Specifically, a material of a film changes its nature depending on saturation of gas that is used on machining and forming a via hole and a groove for a wiring or the like on the low-relative-dielectric-constant-film and a machining process. Thereby, there is concern that the mechanical strength of the material itself of the low-relative-dielectric-constant-film may be lowered, or the adhesive strength on the boundary face in the stacked insulator film including the low-relative-dielectric-constant-film may be lowered.

A shortage of a strength caused by a weakness of the film strength of this low-relative-dielectric-constant-film is a serious obstacle and particularly, this shortage of the strength becomes a factor of lowering a quality, a reliability, a performance or the like of the entire semiconductor device in a multi-layer process to form a multi-layer structure of the wiring in the interlayer-insulator-film formed by the stacked insulator film including the low-relative-dielectric-constant-film. For example, as one main failure caused by a weakness of the film strength of the low-relative-dielectric-constant-film, separation of an insulator film boundary face in a CMP step may be considered. Specifically, in the case that a region made only of an insulator film having no wiring spreads widely to some extents, separation of a boundary face will easily occur in the interlayer-insulator-film due to a stress generated by a friction between a polishing pad and a surface of a wafer in performing CMP. Therefore, in order to prevent such a separation of a boundary face, an art for introducing a reinforcement member having a high strength such as a metal in the region made only of an insulator film having no wiring has been suggested. For example, in Jpn. Pat. Appln. KOKAI Publication No. 2005-150389, an art for arranging a dummy wiring, a dummy plug or the like that does not configure an actual energizing path in the low-relative-dielectric-constant-film has been suggested. Thereby, by easing a stress that is generated by a friction between surfaces of the polish pad and the wafer in performing CMP and is applied to the interlayer-insulator-film, a quality, reliability, performance or the like of the entire semiconductor device are intended to be improved.

An effect of easing the stress on the CMP step by this dummy wiring depends not only on a coverage of the dummy wiring but also on a size of the dummy wiring. However, in practice, an art for optimizing the size of the dummy wiring has not been substantially studied yet. Therefore, a stress lowering effect due to the dummy wiring has not been fully achieved, so that a concern that the boundary face is separated in the CMP has not been completely solved yet. In addition, in designing of the dummy wiring, a designing method in consideration of a mechanical property value of the interlayer-insulator-film employing the low-relative-dielectric-constant-film has not been used. Therefore, every time a generation of the semiconductor device and the design rule thereof is changed or a type of the interlayer-insulator-film is changed, it is necessary to decide a dummy wiring structure in which the boundary face is hardly separated by a trial and an error while expending large amounts of masks and lots. As a result, until a desired dummy wiring structure is obtained, many steps, much manpower, much time, and much cost have been expended. Then, even in the case that optimization of the size of the dummy wiring in consideration of a mechanical property value of the interlayer-insulator-film including the low-relative-dielectric-constant-film is not carried out, there was high possibility that a defect of the device is generated due to the boundary face separation in the CMP.

Thus, according to a conventional dummy wiring art, a crucial failure is easily generated in the semiconductor device and the manufacturing method thereof. In other words, a quality, reliability, a performance or the like of the semiconductor device is lowered and the defective semiconductor device is easily manufactured. As a result, a manufacturing yield of the semiconductor device is lowered and a manufacturing efficiency of the semiconductor device is easily lowered. Further, a manufacturing cost of the semiconductor device is difficult to control.

BRIEF SUMMARY OF THE INVENTION

According to as an aspect of the invention, there is provided a semiconductor device comprising: at least two layers of interlayer-insulator-films stacked above a substrate and at least partially formed by a low-relative-dielectric-constant-film having a relative-dielectric-constant of 3.4 or less respectively; a plurality of wirings provided at least one within each of the interlayer-insulator-film and at least partially located within the low-relative-dielectric-constant-films; a plurality of plugs provided at least one within each of the interlayer-insulator-film and connected to a lower part of the wirings; and a plurality of reinforcement members provided at least one within each of the interlayer-insulator-film with being separated from the wirings at a predetermined interval, electrically cut from the wirings and the plugs, and at least partially located within the low-relative-dielectric-constant-films; and wherein, for each of the reinforcement member, a value obtained by dividing an area of a part that is exposed on an upper face of each of the interlayer-insulator-film by an length of a part contacting each of the interlayer-insulator-film of the part that is exposed on the upper face of each of the interlayer-insulator-film is defined to be S; a Young's modulus of a respective layer on which the plug is provided among the interlayer-insulator-films is defined to be $E_P$; a Young's modulus of a respective layer on which the wiring is provided among the interlayer-insulator-films is defined to be $E_W$; a Young's modulus of the wirings is defined to be $E_M$; a film thickness of a respective layer on which the plug is provided among the interlayer-insulator-films is defined to be $d_P$; a film thickness of a respective layer on which the wiring is provided among the interlayer-insulator-films are defined to be $d_W$; a coverage of the reinforcement member per unit area in an area in the interlayer-insulator-films where the reinforcement members are provided is defined to be R; and the S, the $E_P$, the $E_W$, the $E_M$, the $d_P$, the $d_W$, and the R satisfy a relation shown in the following formula for each of the interlayer-insulator-film:

$$0.025 \times \left( \frac{E_P \times d_P + (E_W \times (1-R) + E_M \times R) \times d_W}{d_P + d_W} \right)^{0.4} <$$

$$S < 0.0625 \times \left( \frac{E_P \times d_P + (E_W \times (1-R) + E_M \times R) \times d_W}{d_P + d_W} \right)^{0.4}$$

DETAILED DESCRIPTION OF THE INVENTION

The respective embodiments according to the present invention will be described with reference to the drawings below.

First Embodiment

First, a first embodiment according to the present invention will be described with reference to FIGS. 1 to 3.

According to the present embodiment, an art for preventing separation of an interlayer-insulator-film in a CMP step in a semiconductor device having a multi-layer structure, in which a plurality of interlayer-insulator-films at least partially including a so-called low-relative-dielectric-constant-film respectively is stacked and a first wiring layer as a lower wiring layer and a second wiring layer as an upper wiring layer are set on predetermined two interlayer-insulator-films among the respective interlayer-insulator-films will be described. Specifically, when providing upper and lower effective wirings to construct an actual energizing path within each of the first and second wiring layers, a dummy wiring that does not construct an actual energizing path is aligned near these effective wirings. In this case, in consideration of a strength and a thickness of a film to configure each interlayer-insulator-film in which the first and second wiring layers are set, the strength of the upper and lower effective wirings, or a coverage of the dummy wiring or the like, the shape and the size or the like of the dummy wiring are defined. Thereby, generation of separation of the interlayer-insulator-film in a CMP step in forming the multi-layer structure is efficiently prevented. Hereinafter, the first embodiment will be specifically described in detail.

Figure 1:
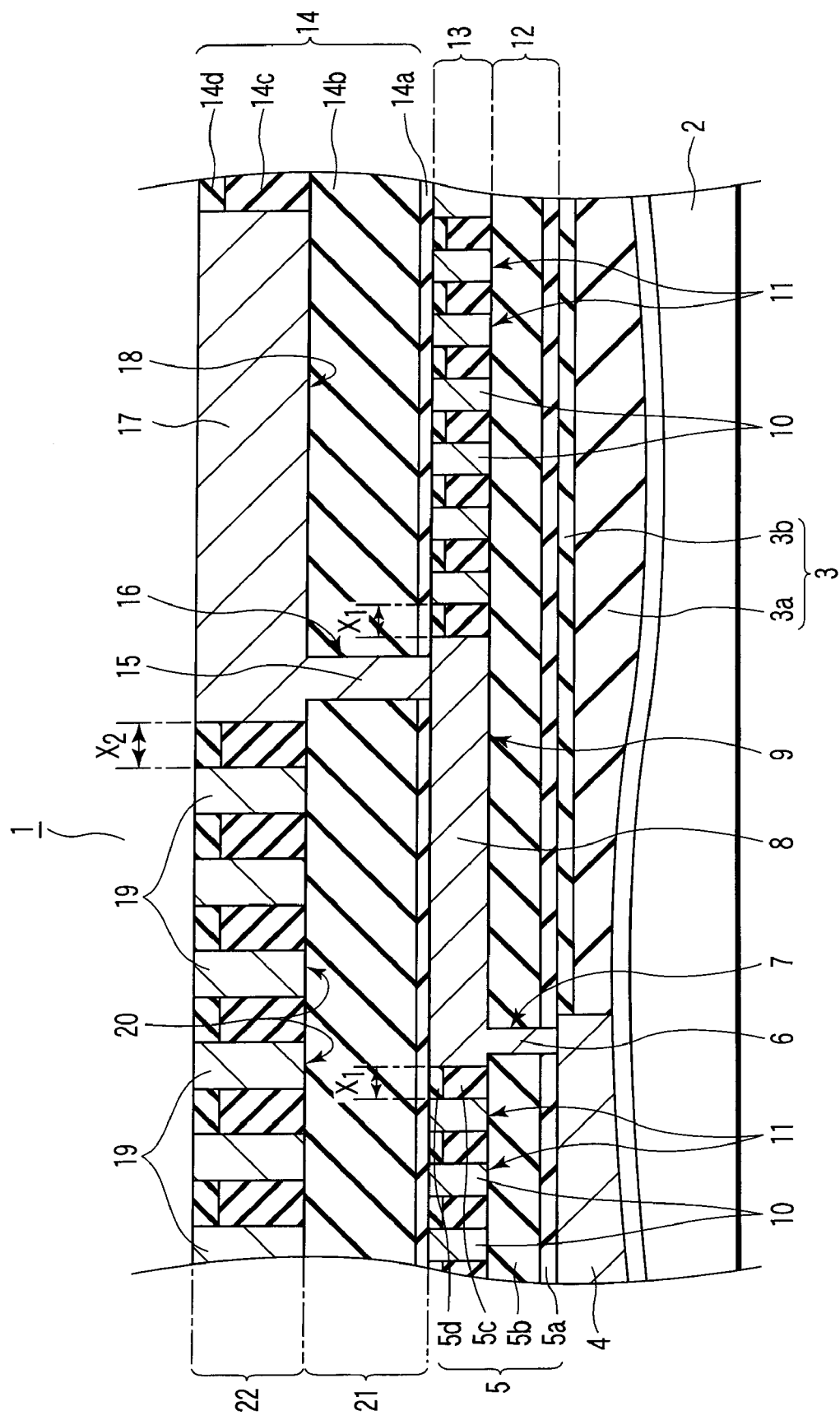
FIG. 1 is a cross sectional view showing a semiconductor device according to a first embodiment.
Figure 2:
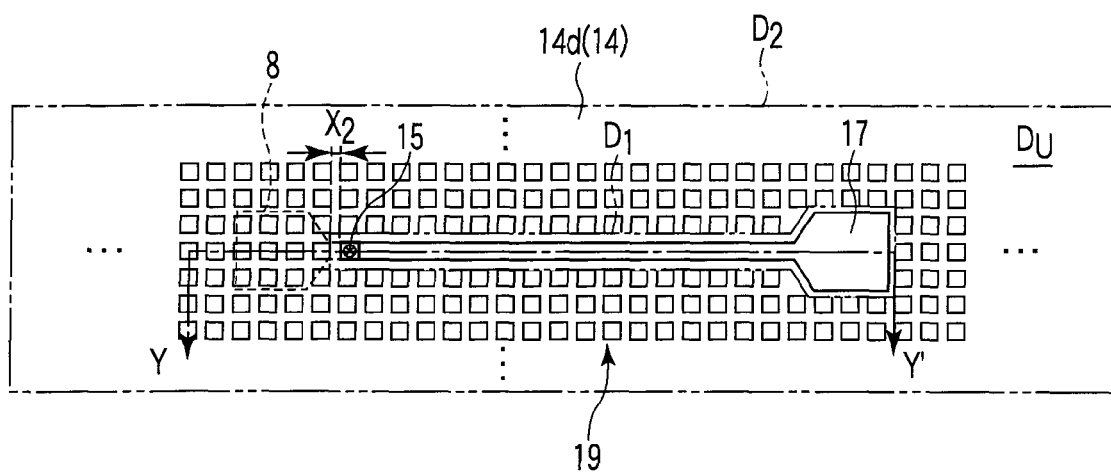
FIG. 2 is a plan view showing the semiconductor device shown in FIG. 1 as seen from above.
Figure 3:
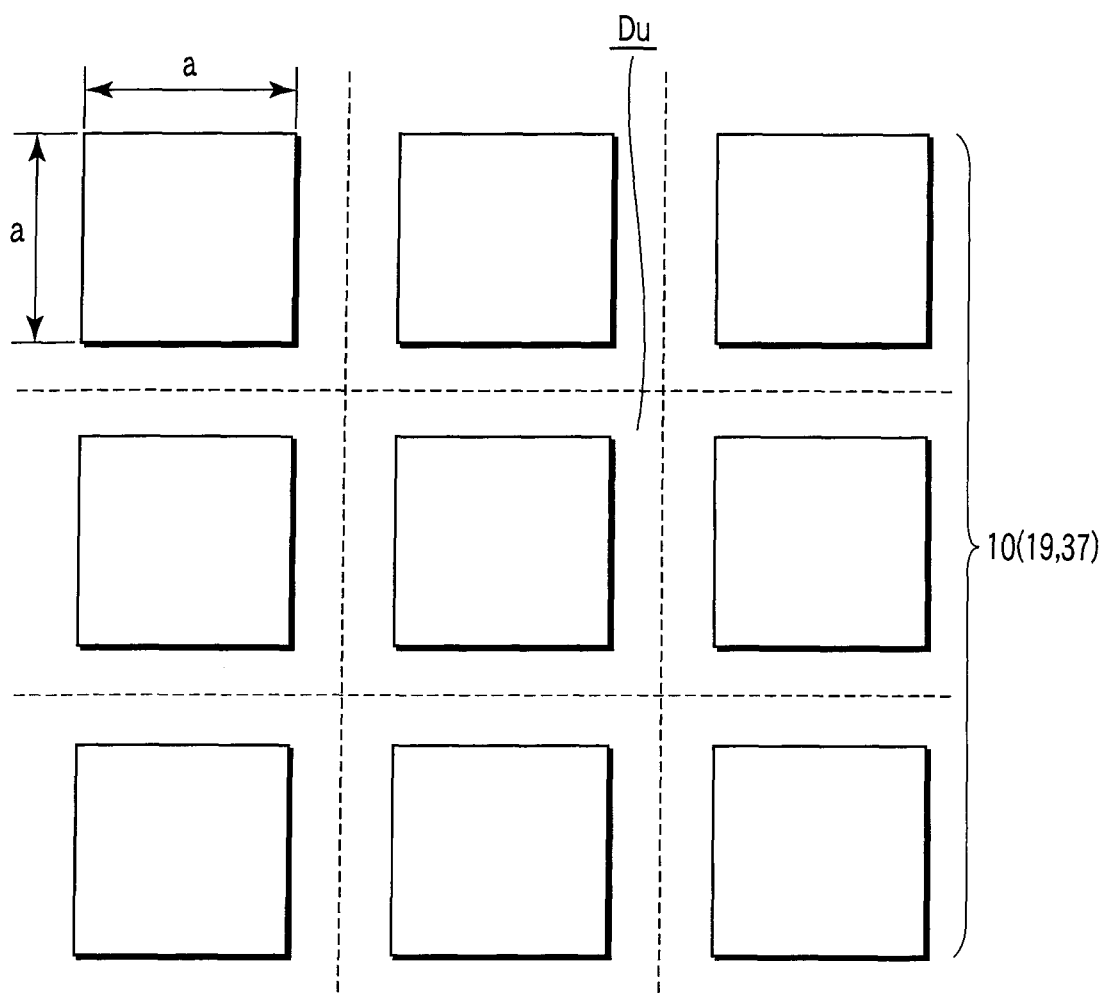
FIG. 3 is a plan view showing a dummy wiring provided to the semiconductor device shown in FIG. 1 as seen from above.

First, with reference to FIGS. 1 to 3, a semiconductor device 1 and a manufacturing method thereof according to the present embodiment will be collectively described.

First, a wiring structure of the nth layer (n is a natural number of 1 or larger) of the semiconductor device 1 is formed. Specifically, as shown in FIG. 1, an interlayer-insulator-film 3 of an n-th layer is provided on a semiconductor substrate 2 made of silicon (Si) on which semiconductor device or the like (not illustrated) is formed. Here, the interlayer-insulator-film 3 of the nth layer is formed into a two-layer structure formed by a stacking film including a lower-layer insulator film 3a and an upper-layer insulator film 3b. First, as a lower insulator film, a porous silicon oxide film (a porous $SiO_2$ film) 3a is deposited by a CVD method. This porous $SiO_2$ film 3a has a relative-dielectric-constant of about 2.2. Accordingly, this porous $SiO_2$ film 3a is a kind of a so-called low-relative-dielectric-constant-film (a low-k film) having a relative dielectric constant of 3.4 or less. In addition, the porous $SiO_2$ film 3a has a Young's modulus showing its mechanical strength of about 3 GPa. Then, on this porous $SiO_2$ film 3a, a silicon oxide film (a $SiO_2$) film 3b that is a general insulator film as an upper layer insulator film is accumulated and deposited by a plasma CVD method. This $SiO_2$ film 3b has a relative dielectric constant of about 4.0 and a Young's modulus of about 55 GPa.

Next, a wiring 4 of the nth layer as wiring of the bottom layer is provided within the interlayer-insulator-film 3 of the nth layer. This wiring 4 of the nth layer is embedded and formed within the interlayer-insulator-film 3 of the nth layer together with a barrier metal film (not illustrated) by a CMP method or the like. In addition, this wiring 4 of the nth layer may be formed by copper (Cu), aluminum (Al), or an alloy containing any of these metal elements. The wiring 4 of the n-th layer constructs an actual energizing path in the semiconductor device 1 together with a wiring 8 of the n+1th layer and a wiring 17 of the (n+2)th layer to be described later or the like. Accordingly, the wiring 4 of the nth layer is also referred to as an effective wiring. In addition, the porous $SiO_2$ film 3a and the $SiO_2$ film 3b, on which the effective wiring 4 is formed, are also referred to as a wiring layer of the nth layer collectively. By these steps, the wiring structure of the nth layer of the semiconductor device 1 is formed.

Next, the wiring structure of the (n+1)th layer of the semiconductor device 1 will be formed. Specifically, first, an interlayer-insulator-film 5 of the (n+1)th layer is provided on the interlayer-insulator-film 3 of the nth layer, in which the wiring 4 of the nth layer is embedded and formed. Here, the interlayer-insulator-film 5 of the (n+1)th layer is formed into a four-layer structure including a first interlayer-insulator film 5a, a second insulator film 5b, a third insulator film 5c, and a fourth insulator film 5d from a lower side toward an upper side.

First, on the $SiO_2$ film 3b, a silicon carbon (SiC) film 5a that is a general insulator film is deposited as a first insulator film with a film thickness of about 35 nm by a plasma CVD method. This SiC film 5a functions as a so-called etching stopper film to prevent the $SiO_2$ film 3b and the wiring 4 of the n-th layer from being etched when forming a via hole 7 of the (n+1)th layer to be described later within the interlayer-insulator film 5 of the (n+1)th layer. The SiC film 5a has a Young's modulus of about 20 Gpa and has higher strength than that of the low relative-dielectric-constant-film. Therefore, the SiC film 5a may also function as a reinforcement film to prevent a via plug 6 of the (n+1)th layer to be provided within the via hole 7 and be described later from being displaced by the CMP step when embedding the wiring 8 of the (n+1)th layer to be connected to the via plug 6 of the (n+1)th layer and to be described later within the interlayer-insulator film 5 of the (n+1)th layer or from being separated from the wiring 4 of the nth layer by holding the via plug 6 of the (n+1)th layer.

Then, on the SiC film 5a, as the second insulator film, a polymethyl siloxane film 5b is deposited with a film thickness of about 135 mm. Specifically, first, a varnish having a material of the polymethyl siloxane film 5b or polymethyl siloxane as a precursor of the polymethyl siloxane film 5b dissolved in a solvent is spin-coated on a surface of the SiC film 5a by using a coater (not illustrated). Then, after mounting a semiconductor substrate 2 on which a varnish is coated on a hot plate that is kept warm at about 80° C., a heating processing of about one minute is applied. Subsequently, after mounting the semiconductor substrate 2 to which heating processing of about 80° C. is applied on a hot plate that is kept warm at about 200° C., further, a heating processing of about one minute is applied. Then, after mounting the semiconductor substrate 2 to which heating processing of about 200° C. is applied on a hot plate that is kept warm at about 450° C., further, a heating processing of about thirty minutes is applied under a nitrogen atmosphere. Thereby, on the SiC film 5a, a polymethyl siloxane film 5b is deposited. This polymethyl siloxane film 5b has a relative-dielectric-constant of about 2.5 and is a kind of a low-relative-dielectric-constant-film. In addition, the polymethyl siloxane film 5b has a Young's modulus of about 3 GPa similarly to the porous $SiO_2$ film 3a of the n-th layer that is described above.

Subsequently, on the polymethyl siloxane film 5b, as the third insulator film, a porous $SiO_2$ film 5c is deposited with a film thickness of about 110 nm by the CVD method. This porous $SiO_2$ film 5c of the (n+1)th layer has a relative-dielectric-constant of about 2.2 similarly to the above-mentioned porous $SiO_2$ film 3a of the n-th layer and is a kind of a low-relative-dielectric-constant-film. In addition, the porous $SiO_2$ film 5c has a Young's modulus of about 3 GPa similarly to the above-mentioned porous $SiO_2$ film 3a and the polymethyl siloxane film 5b. Then, as a fourth insulator film, a carbon-containing $SiO_2$ film (a SiOC film) 5d is formed on this porous $SiO_2$ film 5c with a film thickness of about 50 nm by the plasma CVD method. This SiOC film 5d of the (n+1)th layer has a relative-dielectric-constant of about 3.0 and is a kind of a low-relative-dielectric-constant-film. Further, a Young's modulus of this SiOC film 5d is about 10 GPa.

By these steps, the interlayer-insulator film 5 of the (n+1)th layer formed by a four-layer complex insulator film including the SiC film 5a, the polymethyl siloxane film 5b, the porous $SiO_2$ film 5c, and the SiOC film 5d, of which film qualities and film kinds are different from each other, is deposited on the interlayer-insulator film 3 of the n-th layer. In other words, in the interlayer-insulator film 5 of the (n+1)th layer with a four-layer structure, the second layer to the fourth layer from the lower side are formed by a low-relative-dielectric-constant-film and only the first layer as the bottom layer is formed by a general insulator film.

Next, the via hole 7 for providing the via plug 6 of the (n+1)th layer to be connected to the upper part of the wiring 4 of the nth layer and a wiring groove 9 for providing the wiring 8 of the (n+1)th layer to be connected to the upper part of the via plug 6 are formed within the interlayer-insulator film 5 of the (n+1)th layer. Specifically, first, at the position of the upper part of the wiring 4 of the nth layer where the via plug 6 is provided, by eliminating the SiOC film 5d, the porous $SiO_2$ film 5c, and the polymethyl siloxane film 5b along their film thickness directions until the upper face of the SiC film 5a is exposed by an RIE method, an hole (not illustrated) is formed. Subsequently, at the position of the upper part of this hole where the wiring 8 is provided, by eliminating the SiOC film 5d and the porous $SiO_2$ film 5c along their film thickness directions by the RIE method, the upper face of the polymethyl siloxane film 5b is exposed. Thereby, the wiring groove 9 to be communicated with the upper part of the hole is formed in the SiOC film 5d and the porous $SiO_2$ film 5c. After this, by eliminating the SiC film 5a located on the lower part of the hole by the RIE method, the upper face of the wiring 4 of the nth layer is exposed. Thereby, the via hole 7 to be communicated to the lower part of the wiring groove 9 is formed in the polymethyl siloxane film 5b and the SiC film 5a.

In addition, in the interlayer-insulator film 5 of the (n+1)th layer, not only the via plug 6 and the wiring 8 but also a reinforcement member 10 of the (n+1)th layer for preventing generation of an insulator film separation such as a boundary face separation in the interlayer-insulator-film 5 and in the vicinity of the interlayer-insulator-films 5 in the CMP step when embedding and forming the via plug 6 and the wiring 8 in the interlayer-insulator-films 5 are provided. At least one reinforcement member 10 is provided in the interlayer-insulator-film 5 being electrically cut from the wiring 8 and the via plug 6 and being separated from the wiring 8 by at least a predetermined interval. In addition, the reinforcement member 10 is positioned in an inner part of any one of the low-relative-dielectric-constant-films 5b, 5c, and 5d, at least a part of which forms the interlayer-insulator-film 5. In this case, as shown in FIG. 1, a plurality of the reinforcement members 10 is provided in the porous $SiO_2$ film 5c and the SiOC film 5d constructing a layer in the interlayer-insulator-film 5 where the wiring 8 is provided, being electrically cut from the wiring 8 and the via plug 6 and being separated from the wiring 8 by at least an interval $X_1$. In this case, the interval $X_1$ is determined to be about 2 μm. Then, here, according to the same method as the method for providing the wiring 8, a plurality of the reinforcement members 10 is provided in parallel with providing of the wiring 8 surrounding the periphery of the wiring 8.

Specifically, first, grooves for a reinforcement member 11 for providing the reinforcement member 10 are formed at plural positions in the interlayer-insulator-film 5 in parallel with forming of the wiring groove 9 by the same step as that for forming the wiring groove 9. These grooves for a reinforcement member 11 are formed at approximately the same height as the wiring groove 9 and at approximately the same depth as the wiring groove 9 in the SiOC film 5d and the porous $SiO_2$ film 5c. More specifically, these respective grooves for a reinforcement member 11 are formed at plural positions in the SiOC film 5d and the porous $SiO_2$ film 5c surrounding the periphery of the wiring groove 9, being separated from the wiring groove 9 by at least about 2 μm.

Next, although the illustration thereof is omitted, a barrier metal layer is provided covering inner faces of the via hole 7, the wiring groove 9, and the grooves for a reinforcement member 11 and the surface of the wiring 4 of the nth layer that is exposed by the via hole 7. This barrier metal layer is deposited on the entire surface of the interlayer-insulator-film 5 of the (n+1)th layer under an atmosphere of about 150° C. by a sputtering method, for example. This barrier metal layer may be formed by using any of a Ta film, a Ti film, a Nb film, and a W film made of an elemental substance of each of tantalum (Ta), titanium (Ti), niobium (Nb) and tungsten (X). Alternatively, this barrier metal layer may be formed by using any of a TaN film, a TiN film, a NbN film, and a WN film made of a nitride of Ta, Ti, Nb, and W. Further, this barrier metal layer may be formed by using a stacked film containing at least two kinds of films among Ta film, Ti film, Nb film, W film, TaN film, TiN film, NbN film, WN film, a ruthenium (Ru) film, and a rhodium (Rh) film.

Next, insides of the via hole 7, the wiring groove 9, and the grooves for a reinforcement member 11 to which the barrier metal layer is provided, a conductive material to be the via plug 6, the wiring 8, and the reinforcement members 10 is arranged. The via plug 6, the wiring 8, and the reinforcement members 10 may be formed by using Cu, Al, or an alloy containing any of the metal elements similarly to the above-described wiring 4 of the nth layer. In this case, all of the via plug 6, the wiring 8, and the reinforcement members 10 are formed by using Cu. Specifically, first, a Cu plating seed layer that is the base of the via plug 6, the wiring 8, and the reinforcement members 10 is deposited on the entire surface of the barrier metal layer by the sputtering method. Then, a Cu plating film that is a main part of the via plug 6, the wiring 8, and the reinforcement members 10 is deposited on the entire surface of the Cu plating seed layer by an electrolytic plating method until insides of the via hole 7, the wiring groove 9, and the grooves for a reinforcement member 11 is filled. This Cu plating film is deposited to be integrated with the Cu plating seed layer. Thereby, a Cu film to be the via plug 6, the wiring 8, and the reinforcement members 10 entirely covers the surface of the barrier metal layer to be deposited insides of the via hole 7, the wiring groove 9, and the respective grooves for a reinforcement member 11. A Young's modulus of this Cu film is about 130 GPa.

Next, the Cu film that is arranged in the via hole 7, the wiring groove 9, and the respective grooves for a reinforcement member 11 is annealed. Although the illustration thereof is omitted, this anneal processing will be carried out in a temperature range of about 150° C. to 300° C. by using an electric furnace, a hot plate, or the like and under an atmosphere of a forming gas or a nitrogen gas. In addition, a time required for this anneal processing is about one hour when using the electric furnace and is about one to five minutes when using the hot plate.

Next, unnecessary barrier metal layer and Cu film provided outsides of the via hole 7, the wiring groove 9, and the respective grooves for a reinforcement member 11 are eliminated. Specifically, a barrier metal layer and a Cu film deposited on the surface of the SiOC film 5d that is the insulator film of the top layer of the interlayer-insulator-film 5 of the (n+1)th layer are polished and eliminated by the CMP method. Thereby, the barrier metal layer and the Cu layer are left only insides of the via hole 7, the wiring groove 9, and the respective grooves for a reinforcement member 11. In other words, the via plug 6, the wiring 8, and the reinforcement members 10, of which side parts and bottom parts are covered with the barrier metal layer, are embedded and formed in the interlayer-insulator-film 5 of the (n+1)th layer in parallel.

The via plug 6 is arranged with its upper part located in the polymethyl siloxane film 5b that is a low-relative-dielectric-constant-film and its lower part located in the SiC film 5a having a higher strength than the low-relative-dielectric-constant-film. In addition, the wiring 8 is formed as a so-called dual damascene wiring having a lower part to which the via plug 6 is connected integrally. In addition, the wiring 8 is located in the porous $SiO_2$ film 5c and the SiOC film 5d that are the low-relative-dielectric-constant-films and its lower face is connected to the polymethyl siloxane film 5b that is also the low-relative-dielectric-constant-film via the barrier metal layer.

In addition, as shown in FIG. 1, the reinforcement members 10 are arranged to be electrically cut from the wiring 8 and the via plug 6. Therewith, a plurality of the reinforcement members 10 is arranged surrounding the periphery of the wiring 8, being separated from the wiring 8 by at least about 2 μm. Similarly to the wiring 8, these respective the reinforcement members 10 are also located in the porous $SiO_2$ film 5c and the SiOC film 5d with its lower face contacting the polymethyl siloxane film 5b via the barrier metal layer.

According to these steps, the wiring structure of the (n+1)th layer of the semiconductor device 1 is formed. Further, a more specific setting related to the size, the shape, or the arrangement of the reinforcement member 10 of the (n+1)th layer will be described in detail later.

The wiring 8 of the (n+1)th layer configures an actual energizing path of the semiconductor device 1 together with the via plug 6 of the (n+1)th layer that is formed to be integrated with the wiring 8 of the (n+1)th layer and the wiring 4 of the nth layer that is indirectly connected to the wiring 8 of the (n+1)th layer via this via plug 6. On the contrary, the reinforcement members 10 of the (n+1)th layer are not electrically connected to the wiring 8, the via plug 6 or the like, so that they do not configure the actual energizing path of the semiconductor device 1. As a result, in the later descriptions, in order to clearly distinguish the wiring 8 of the (n+1)th layer from the reinforcement members 10 of the (n+1)th layer, the wiring 8 will be referred to as a effective wiring of the (n+1)th layer and the reinforcement members 10 will be referred to as a dummy wiring of the (n+1)th layer. In addition, the lower two layers on which the via plug 6 is formed among the interlayer-insulator film 5 of the (n+1)th layer, namely, the SiC film 5a and the polymethyl siloxane film 5b will be also referred to as a via layer of the (n+1)th layer or a plug layer 12 collectively. Similarly, the upper two layers on which the effective wiring 8 and the respective dummy wirings 10 are formed among the interlayer-insulator film 5 of the (n+1)th layer, namely, the porous $SiO_2$ film 5c and the SiOC film 5d will be also referred to as an wiring layer 13 of the (n+1)th layer collectively.

Next, the wiring structure of the (n+2)th layer of the semiconductor device 1 is formed. Specifically, first, an interlayer-insulator-film 14 of the (n+2)th layer is provided on the interlayer-insulator-film 5 of the (n+1)th layer, in which the via plug 6, the effective wiring 8, and the respective dummy wirings 10 of the (n+1)th layer are embedded and formed. Here, similarly to the above-described interlayer-insulator-film 5 of the (n+1)th layer, the interlayer-insulator-film 14 of the (n+2)th layer is also formed into a four-layer structure including a first insulator film 14a, a second insulator film 14b, a third insulator film 14c, and a fourth insulator film 14d from a lower side toward an upper side.

First, a silicon carbon nitride film (SiCN film) 14a that is general as the first insulator film is deposited with a film thickness of about 50 nm by the plasma CVD method, covering the surfaces of the SiOC film 5d that is the insulator film on the top layer of the interlayer-insulator-film 5 of the (n+1)th layer, the effective wiring 8, and the respective dummy wirings 10. Similarly to the above-described SiC film 5a of the (n+1)th layer, this SiCN film 14a functions as an etching stopper film to prevent the SiOC film 5d, the effective wiring 8, and the respective dummy wirings 10 from being etched when forming the via hole 16 of the (n+2)th layer to be described later in the interlayer-insulator-film 14 of the (n+2)th layer. In addition, the Young's modulus of the SiCN film 14a is about 100 GPa, so that the strength thereof is remarkably higher than that of the SiC film 5a. Therefore, similarly to the SiC film 5a, the SiCN film 14a may also function as a reinforcement film to prevent a via plug 15 of the (n+2)th layer to be provided in the via hole 16 and be described later from being displaced by the CMP step when embedding a wiring 17 of the (n+2)th layer to be connected to the via plug 16 and be described later in the interlayer-insulator-film 14 of the (n+2)th layer or from being separated from the effective wiring 8 of the (n+1)th layer by holding the via plug 15.

Then, on the SiCN film 14a, as the second insulator film, a carbon-containing $SiO_2$ film (SiOC film) 14b is formed with a film thickness of about 230 nm by the plasma CVD method. This SiOC film 14b of the (n+2)th layer has a relative dielectric constant of about 3.0 similarly to the above-described SiOC film 5d of the (n+1)th layer and is a kind of a low-relative-dielectric-constant-film. Further, a Young's modulus of the SiOC film 14b is about 10 GPa similarly to the SiOC film 5d. Then, on this SiOC film 14b, as the third insulator film, the porous $SiO_2$ film 14c is formed with a film thickness of about 175 nm by the plasma CVD method. This porous $SiO_2$ film 14c of the (n+2)th layer also has a relative dielectric constant of about 2.2 similarly to the above-described porous $SiO_2$ film 3a of the n-th layer and porous $SiO_2$ film 5c of the (n+1)th layer and is a kind of a low-relative-dielectric-constant-film. Further, a Young's modulus of the porous $SiO_2$ film 14c is also about 3 GPa similarly to each of the porous $SiO_2$ films 3a and 5c. Then, on this porous $SiO_2$ film 14c, as the fourth insulator film, the $SiO_2$ film 14d is formed with a film thickness of about 50 nm by the plasma CVD method. This $SiO_2$ film 14d of the (n+2)th layer also has a relative dielectric constant of about 4.0 similarly to the above-described $SiO_2$ film 3b of the n-th layer and is a general insulator film. Therewith, a Young's modulus of the $SiO_2$ film 14d is about 55 GPa similarly to the $SiO_2$ film 3b.

According to these steps, similarly to the above-described interlayer-insulator film 5 of the (n+1)th layer, the interlayer-insulator-film 14 of the (n+2)th layer formed by a four-layer complex insulator film having different film qualities and film kinds of the SiCN film 14a, the SiOC film 14b, the porous $SiO_2$ film 14c, and the $SiO_2$ film 14d is deposited on the interlayer-insulator film 5 of the (n+1)th layer. In other words, in the interlayer-insulator-film 14 of the (n+2)th layer formed in a four-layer structure, the second layer and the third layer, i.e. the two intermediate layers are configured by the low-relative-dielectric-constant-film, and the first layer, i.e. the bottom layer and the fourth layer, i.e. the top layer are configured by a general insulator film.

Next, the via plug 15 of the (n+2)th layer to be connected to the upper part of the effective wiring 8 of the (n+1)th layer and the wiring (effective wiring) 17 of the (n+2)th layer to be connected to the upper part of the via plug 15 are arranged in the interlayer-insulator-film 14 of the (n+2)th layer. Therewith, the reinforcement members (dummy wirings) 19 of the (n+2)th layer are arranged in the interlayer-insulator-film 14 of the (n+2)th layer. These via plug 15, effective wiring 17, and dummy wiring 19 of the (n+2)th layer may be formed by the same method as the above-described method for forming the via plug 6, effective wiring 8, and dummy wiring 10 of the (n+1)th layer. Hereinafter, this method will be briefly described.

First, at the position of the upper part of the effective wiring 8 of the (n+1)th layer where the via plug 15 is arranged, by eliminating the $SiO_2$ film 14d, the porous $SiO_2$ film 14c, and the SiOC film 14b along their film thickness directions by the RIE method until the upper face of the SiCN film 14a is exposed, a hole is formed (not illustrated). Then, at the position of the upper part of this hole where the effective wiring 17 is arranged, by eliminating the $SiO_2$ film 14d and the porous $SiO_2$ film 14c along their film thickness directions by the RIE method, the upper face of the SiOC film 14b is exposed. Thereby, the wiring groove (effective wiring groove) 18 for arranging the effective wiring 17 of the (n+2)th layer is communicated with the upper part of the hole to be formed in the $SiO_2$ film 14d and the porous $SiO_2$ film 14c.

In addition, in parallel with forming of the effective wiring groove 18, at plural positions surrounding the periphery of the effective wiring groove 18, by eliminating the $SiO_2$ film 14d and the porous $SiO_2$ film 14c along their film thickness directions by the RIE method, the upper face of the SiOC film 14b is exposed. Thereby, dummy wiring grooves (grooves for a reinforcement member) 20 for arranging the dummy wiring 19 of the (n+2)th layer are formed at plural positions in the $SiO_2$ film 14d and the porous $SiO_2$ film 14c at approximately the same height as that of the effective wiring groove 18 and with approximately the same depth as that of the effective wiring groove 18.

Similarly to the respective dummy wiring grooves 11 of the (n+1)th layer, a plurality of the respective dummy wiring grooves 20 of the (n+2)th layer are separated from the effective wiring groove 18 by at least a predetermined interval $X_2$, surrounding the periphery of the effective wiring groove 18. In this case, the interval $X_2$ is determined to be about 2 μm similarly to the interval $X_1$ between the effective wiring 8 and the dummy wiring 10 of the (n+1)th layer. Further, in FIG. 1, the respective dummy wiring grooves 20 that are formed on the left side of the effective wiring groove 18 among a plurality of the dummy wiring grooves 20 are only illustrated. After this, by eliminating the SiCN film 14a on the lower part of the hole by the RIE method, the upper face of the effective wiring 8 of the (n+1)th layer is exposed. Thereby, the via hole 16 for providing the via plug 15 of the (n+2)th layer is formed in the SiCN film 14a and the SiOC film 14b to be communicated with the lower part of the effective wiring groove 18.

Next, the barrier metal layer of the (n+2)th layer (not illustrated) is entirely deposited on the surface under an atmosphere of about 150° C. by the sputtering method, covering inner faces of the via hole 16 of the (n+2)th layer, the effective wiring groove 18, the respective dummy wiring grooves 20 and the surface of the effective wiring 8 of the (n+1)th layer that is exposed by the via hole 16, and the surface of the $SiO_2$ film 14d that is a film of the top layer of the interlayer-insulator-film 14 of the (n+2)th layer or the like. Then, while filling insides of the via hole 16, the effective wiring groove 18, and the respective dummy wiring grooves 20 on which the barrier metal layer of the (n+2)th layer is arranged, by the sputtering method and the electrolytic plating method, the Cu film of the (n+2)th layer is deposited on the entire surface of the barrier metal layer of the (n+2)th layer. The Young's modulus of this Cu film of the (n+2)th layer is also about 130 GPa similarly to that of the above-described Cu film of the (n+1)th layer. Then, the anneal processing is applied to the Cu film of the (n+2)th layer under the same condition as the Cu film of the (n+1)th layer. After this, unnecessary barrier metal layer and Cu film are polished and eliminated by the CMP method, which are arranged outsides of the via hole 16, the effective wiring groove 18, and the respective dummy wiring grooves 20. Thereby, the via plug 15, the effective wiring 17, and the respective dummy wirings 19 of which side part and bottom part are covered with the barrier metal layer, are embedded and formed in the interlayer-insulator-film 14 of the (n+2)th layer in parallel.

The via plug 15 is arranged with its upper part located in the SiOC film 14b that is a low-relative-dielectric-constant-film and its lower part located in the SiCN film 14a having a higher strength than the low-relative-dielectric-constant-film. In addition, similarly to the above-described effective wiring 8 of the (n+1)th layer, the effective wiring 17 is formed as a dual damascene wiring having a lower part to which the via plug 15 is connected integrally. In addition, the effective wiring 17 is arranged with its upper part located in the general $SiO_2$ film 14d, of which strength is higher than the low-relative-dielectric-constant-film, and its lower part located in the porous $SiO_2$ film 14c that is the low-relative-dielectric-constant-film. Further, the lower face of the effective wiring 17 contacts the SiOC film 14b that is also the low-relative-dielectric-constant-film via the barrier metal layer.

In addition, as shown in FIG. 1, the respective dummy wirings 19 are provided, being electrically cut from the effective wiring 17 and the via plug 15. In practice, a plurality of the respective dummy wirings 19 is separated from the effective wiring 17 by at least 2 µm, surrounding the periphery of the effective wiring 17. In FIG. 1, the respective dummy wirings 19 provided on the left side of the effective wiring 17 are only illustrated. In addition, similarly to the effective wiring 17, these respective dummy wirings 19 are arranged with their upper parts located in the $SiO_2$ film 14d and their lower parts located in the porous $SiO_2$ film 14c. Further, the lower faces of the respective dummy wirings 19 contact the SiOC film 14b via the barrier metal layer.

In addition, the effective wiring 17 of the (n+2)th layer may configure an actual energizing path of the semiconductor device 1 together with the via plug 15 of the (n+2)th layer that is formed to be integrated with the effective wiring 17, the effective wiring 8 and the via plug 6 of the (n+1)th layer that are indirectly connected to the effective wiring 17 via this via plug 15, and the effective wiring 4 of the n-th layer. On the contrary, similarly to the respective dummy wirings 10 of the (n+1)th-layer, the respective dummy wirings 19 of the (n+2)th layer do not configure the actual energizing path of the semiconductor device 1.

According to these steps, the wiring structure of the (n+2)th layer of the semiconductor device 1 is formed. In other words, the semiconductor device 1 according to the present embodiment having a multi-layer wiring structure shown in FIG. 1 is obtained. Further, a more specific setting related to the sizes, the shapes, or the arrangements of the respective dummy wirings 19 of the (n+2)th layer will be also described in detail later together with the setting related to the sizes, the shapes, or the arrangements of the respective dummy wirings 10 of the (n+1)th layer. In addition, the lower two layers on which the via plug 15 is formed among the interlayer-insulator-film 14 of the (n+2)th layer, namely, the SiCN film 14a and the SiOC film 14b will be also referred to as a via layer of the (n+2)th layer or a plug layer 21 collectively. In the same way, the upper two layers on which the effective wiring 17 and the respective dummy wirings 19 are formed among the interlayer-insulator-film 14 of the (n+2)th layer, namely, the porous $SiO_2$ film 14c and the $SiO_2$ film 14d will be also referred to as a wiring layer 22 of the (n+2)th layer collectively.

FIG. 2 is a plan view showing the semiconductor device 1, on which a wiring structure of an (n+2)th layer is formed, as seen from above. In addition, FIG. 1 is a cross sectional view showing the semiconductor device 1 along a break line Y-Y' in FIG. 2. In FIG. 2, the region extended from a dashed-two dotted line $D_1$ that is drawn along the effective wiring 17 of the (n+2)th layer to the outside is the region where the dummy wirings 19 are aligned. Then, in FIG. 2, in the region that is surrounded by the dashed-two dotted line $D_1$ and a dashed-two dotted line $D_2$ that is drawn outside of the dashed-two dotted line $D_1$, there is a unit area $D_U$ for calculating a coverage R by the dummy wiring 19 to be described later. Further, in FIG. 2, in order to facilitate visualization of the drawing, only a part of a plurality of the dummy wirings 19 to be arranged in the dummy wiring forming area of the (n+2)th layer is illustrated and the illustration of the remaining dummy wirings 19 is omitted.

FIG. 3 shows a shape and an arrangement pattern of each of the respective dummy wirings 10 and 19 of the (n+1)th layer and the (n+2)th layer. As shown in FIG. 3, the respective dummy wirings 10 and 19 are formed in a square in which a length of one side is a. According to the present embodiment, the length "a" of one side of the respective dummy wirings 10 and 19 is determined to be about 0.1 to several µm. Then, in the dummy wiring forming areas in the respective interlayer-insulator-film 5 and 14 of the (n+1)th layer and the (n+2)th layer, the respective dummy wirings 10 and 19 shaped in a square are aligned so as to regularly form a dotted pattern in a planar view and surround the respective effective wirings 8 and 17. Thus, in the case that a pattern to regularly form the dummy wirings 10 and 19 of a predetermined shape is aligned within the dummy wiring forming area, as shown in FIG. 3, defining the smallest unit of a shape to be repeated in a planar view as a unit area $D_U$, a coverage of the dummy wirings 10 and 19 can be obtained.

Next, with reference to FIGS. 1 to 3, setting of the size, shape, and arrangement or the like of the respective dummy wirings 10 of the (n+1)th layer and the respective dummy wirings 19 of the (n+2)th layer will be specifically described in detail.

According to the present embodiment, as described above, when arranging the effective wiring 8 of the (n+1)th layer within the interlayer-insulator film 5 of the (n+1)th layer including the polymethyl siloxane film 5b, the porous $SiO_2$ film 5c, and the SiOC film 5d of the (n+1)th layer that are low-relative-dielectric-constant-films, the respective dummy wirings 10 of the (n+1)th layer are also arranged surrounding the periphery of the effective wiring 8. Thereby, concentration of a stress in the vicinity of the effective wiring 8 is eased, which is generated by a friction between surfaces of a polish pad (not illustrated) and the interlayer-insulator-film 5 (the SiOC film 5d) and the effective wiring 8 when embedding and forming the effective wiring 8 of the (n+1)th layer in the interlayer-insulator film 5 of the (n+1)th layer by the CMP step. Further, a film separation, namely, a so-called boundary face separation is prevented from being generated by a stress generated in the CMP step on each boundary face of the SiC film 5a, the polymethyl siloxane film 5b, the porous $SiO_2$ film 5c, and the SiOC film 5d to configure the interlayer-insulator-film 5. Alternatively, a boundary face separation is prevented from being generated on a boundary face between the interlayer-insulator-film 5 and the interlayer-insulator-film 3 of the n-th layer ($SiO_2$ film 3b).

In the same way, when arranging the effective wiring 17 of the (n+2)th layer in the interlayer-insulator-film 14 of the (n+2)th layer including the SiOC film 14b and the porous SiO$_2$ film 14c that are the low-relative-dielectric-constant-films, the respective dummy wirings 19 of the (n+2)th layer are also aligned surrounding the periphery of the effective wiring 17. Thereby, concentration of a stress in the vicinity of the effective wiring 17 is eased, which is generated by a friction between surfaces of a polish pad (not illustrated) and the interlayer-insulator-film 14 (the SiO$_2$ film 14d) and the effective wiring 17 when embedding and forming the effective wiring 17 of the (n+2)th layer in the interlayer-insulator-film 14 of the (n+2)th layer by the CMP step. Further, a boundary face separation is prevented from being generated by a stress generated in the CMP step on each boundary face of the SiCN film 14a, the SiOC film 14b, the porous SiOC$_2$ film 14c, and a SiOC$_2$ film 14d to configure the interlayer-insulator-film 14. Alternatively, a boundary face separation is prevented from being generated on a boundary face between the interlayer-insulator-film 14 and the interlayer-insulator film 5 of the (n+1)th layer (SiOC film 5d).

According to the present embodiment, in order to efficiently obtain such an effect for easing a stress in the CMP step, the respective dummy wirings 10 of the (n+1)th layer and the respective dummy wirings 19 of the (n+2)th layer will be aligned in accordance with a rule to be described below for each layer.

First, for the wiring structure of the (n+1)th layer, a value obtained by dividing the area of the part that is exposed on the upper face of the interlayer-insulator film 5 of the (n+1)th layer among the respective dummy wirings 10 of the (n+1)th layer by a length of the part contacting the interlayer-insulator-film 5 of the exposed portion is defined to be S (μm). In other words, S is a value obtained by dividing the exposed areas of the respective dummy wirings 10 by a sum of the lengths of boundary faces between the exposed portions and the interlayer-insulator-film 5. In addition, a Young's modulus of the above-described via layer 12 of the (n+1)th layer where the above-described via plug 6 of the (n+1)th layer is arranged in the interlayer-insulator film 5 of the (n+1)th layer is defined to be $E_P$ (GPa). In addition, a Young's modulus of the wiring layer 13 of the (n+1)th layer where the above-described effective wiring of the (n+1)th layer 8 is arranged in the interlayer-insulator film 5 of the (n+1)th layer is defined to be $E_W$ (GPa). In addition, a Young's modulus of the effective wiring 8 of the (n+1)th layer is defined to be $E_M$ (GPa). In addition, a film thickness of the via layer 12 of the (n+1)th layer in the interlayer-insulator film 5 of the (n+1)th layer is defined to be $d_P$ (nm). In addition, a film thickness of the wiring layer 13 of the (n+1)th layer in the interlayer-insulator film 5 of the (n+1)th layer is defined to be $d_W$ (nm). Further, a coverage of each dummy wiring 10 of the (n+1)th layer per unit area $D_U$ on the upper face of the interlayer-insulator film 5 of the (n+1)th layer excluding the area where the effective wiring 8 of the (n+1)th layer is defined to be R.

In the same way, for the wiring structure of the (n+2)th layer, a value obtained by dividing the area of the part that is exposed on the upper face of the interlayer-insulator-film 14 of the (n+2)th layer among the respective dummy wirings 19 of the (n+2)th layer by a length of the part contacting the interlayer-insulator-film 14 in the exposed portion is defined to be S (μm). In addition, a Young's modulus of the above-described via layer 21 of the (n+2)th layer where the above-described via plug 15 of the (n+2)th layer is arranged in the interlayer-insulator-film 14 of the (n+2)th layer is defined to be $E_P$ (GPa). In addition, a Young's modulus of the wiring layer 22 of the (n+2)th layer where the above-described effective wiring 17 of the (n+2)th layer is arranged in the interlayer-insulator-film 14 of the (n+2)th layer is defined to be $E_W$ (GPa). In addition, a Young's modulus of the effective wiring 17 of the (n+2)th layer is defined to be $E_M$ (GPa). In addition, a film thickness of the via layer 21 of the (n+2)th layer in the interlayer-insulator-film 14 of the (n+2)th layer is defined to be $d_P$ (nm). In addition, a film thickness of the wiring layer 22 of the (n+2)th layer in the interlayer-insulator-film 5 of the (n+2)th layer is defined to be $d_W$ (nm). Further, a coverage of each dummy wiring 19 of the (n+2)th layer per unit area $D_U$ on the upper face of the interlayer-insulator-film 14 of the (n+2)th layer excluding the area where the effective wiring 17 of the (n+2)th layer is defined to be R.

Under such definitions, the shape, the size or the like of the respective dummy wirings 10 and 19 will be determined so that S, $E_P$, $E_W$, $E_M$, $d_P$, $d_W$, and R satisfy a relation shown by the following formula (1) for each of the respective interlayer-insulator-film 5 and 14.

$$0.025 \times \left( \frac{E_P \times d_P + (E_W \times (1-R) + E_M \times R) \times d_W}{d_P + d_W} \right)^{0.4} < \quad (1)$$
$$S < 0.0625 \times \left( \frac{E_P \times d_P + (E_W \times (1-R) + E_M \times R) \times d_W}{d_P + d_W} \right)^{0.4}$$

In this formula (1), the following formula (2) shows a complex Young's modulus of the (n+1)th layer, which is a Young's modulus within the dummy wiring forming area of the entire interlayer-insulator film 5 of the (n+1)th layer where the via layer 12 of the (n+1)th layer is added to the wiring layer 13 of the (n+1)th layer. Alternatively, they show the complex Young's modulus of the (n+2)th layer, which is a Young's modulus within the dummy wiring forming area of the entire interlayer-insulator-film 14 of the (n+2)th layer where the via layer 21 of the (n+2)th layer is added to the wiring layer 22 of the (n+2)th layer.

$$\left( \frac{E_P \times d_P + (E_W \times (1-R) + E_M \times R) \times d_W}{d_P + d_W} \right) \quad (2)$$

Generally, when embedding and forming the wiring in the interlayer-insulator-film it by the CMP method, a relatively large load is given to the upper part of the wiring by a friction between the polish pad and the wiring. Due to this external load, a stress is concentrated on the wiring and the via plug to be connected to the lower part of the wiring. Then, due to this stress concentration, a defect due to a boundary face separation is easily generated inside and outside of the interlayer-insulator-film. Such a phenomenon is generated more easily in the case that at least a part of the interlayer-insulator-film is formed by a low-relative-dielectric-constant-film, of which film structure is scarcer and mechanical strength is lower than a general insulator film. Particularly, in the case that at least a part of the wiring is arranged reaching the inside of the low-relative-dielectric-constant-film, this phenomenon is more remarkable.

The specific and detailed explanation referring to illustration is omitted; however, in order to resolve a mechanism of generation of a defect of a boundary face separation in such a CMP step, the inventors of the present invention conducted various separation tests and analysis by a stress simulation. As a result of this analysis, it has become clear that the stress to be given to the wiring and the via plug in the CMP step depends on the complex Young's modulus of a material to form the wiring layer and the via layer, and the coverage and the size of the wiring. Then, it has become clear that, by aligning the respective dummy wirings 10 and 19 so as to satisfy the above-described formula (1), the stress concentration on the respective effective wirings 8 and 17 and the respective via plugs 6 and 15 in the CMP step is efficiently eased so as to efficiently prevent a defect due to separation of an insulator film such as a boundary face separation. In other words, it has been know that, in the semiconductor device 1 having the above-described multi-layer wiring structure, by aligning the respective dummy wirings 10 and 19 so as to satisfy the above-described formula (1) for each of the respective interlayer-insulator-films 5 and 14, it is possible to efficiently prevent separation of the interlayer-insulator-film when embedding the respective effective wirings 8 and 17 in the respective interlayer-insulator-films 5 and 14 by the CMP method to be formed contacting the respective low-relative-dielectric-constant-films 5b, 5c, 5d, 14b, and 14c forming a part of the interlayer-insulator-films 5 and 14.

In addition, as described above, the respective via layers 12 and 21 and the respective wiring layers 13 and 22 of the (n+1)th layer and the (n+2)th layer according to the present embodiment are configured by a stacked film of two layers of the insulator film. In such a case, in order to accurately calculate the above-described formula (1), the Young's modulus $E_P$ of the respective via layers 12 and 21 and the Young's modulus $E_W$ of the respective wiring layers 13 and 22 are replaced by a complex Young's modulus $E_C$ that is the Young's modulus of the entire stacking layers to configure the respective via layers 12 and 21 and the respective wiring layers 13 and 22. In the same way, a film thickness $d_P$ of the respective via layers 12 and 21 and a film thickness $d_W$ of the respective wiring layers 13 and 22 are replaced by a total film thickness $d_T$ that is the film thickness of the entire stacking layers to configure the respective via layers 12 and 21 and the respective wiring layers 13 and 22.

These complex Young's modulus $E_C$ and the total film thickness $d_T$ can be obtained by the following formulas (3) and (4).

$$E_C = \frac{\sum_i E_i d_i}{\sum_i d_i} \quad (3)$$

(i: Natural number not less than 1)

$$d_T = \sum_i d_i \quad (4)$$

(i: Natural number not less than 1)

In the formula (3), $E_i$ represents a Young's modulus $E_i$ of the i-th insulator film from top or bottom in the respective insulator films to configure the respective via layers 12 and 21 and the respective wiring layers 13 and 22. In addition, in the formula (3) and the formula (4), $d_i$ represents the film thickness of the i-th insulator film from top or bottom in the respective insulator films to configure the respective via layers 12 and 21 and the respective wiring layers 13 and 22.

Next, a plurality of samples manufactured by the inventors of the present invention on the basis of the above-described present embodiment will be described with reference to Tables 1 to 6. These respective samples according to the present embodiment are manufactured on the basis of the setting to be described next.

First, as shown in FIG. 3, the respective dummy wirings 10 and 19 are formed into a square in which a length of one side is a. In this case, by changing the value of "a" that is an index of sizes of the respective dummy wirings 10 and 19 in increments of about 0.1 μm or about 0.5 μm up to about 0.1 to 2 μm, a plurality of dummy wirings 10 and 19 having different sizes are formed and they are 12 kinds in total. Then, these respective dummy wirings 10 and 19 having various sizes are aligned within the respective interlayer-insulator-films 5 and 14 of the (n+1)th layer and the (n+2)th layer so as to form a dotted pattern as shown in FIG. 3. In this case, these respective dummy wirings 10 and 19 are set so that a coverage R of the respective dummy wirings 10 and 19 takes different three values of about 11%, 25%, and 44% for each layer of the (n+1)th layer and the (n+2)th layer.

Then, for each sample manufactured on the basis of such a setting, presence/absence of the insulator film separation of the interlayer-insulator-film 5 of the (n+1)th layer after the effective wiring 8 of the (n+1)th layer is embedded and formed by the CMP method is observed by using an optical microscope. The observation results for these interlayer-insulator film 5 of the (n+1)th layer are shown in Tables 1 to 3. In the same way, for each sample, presence/absence of the insulator film separation of the interlayer-insulator-film 14 of the (n+2)th layer after the effective wiring 17 of the (n+2)th layer is embedded and formed by the CMP method is observed by using an optical microscope. The observation results for these interlayer-insulator-film 14 of the (n+2)th layer are shown in Tables 4 to 6.

In these Tables 1 to 6, the length a of one side of the respective dummy wirings 10 and 19, S obtained by dividing the areas of the respective dummy wirings 10 and 19 by the perimeters thereof, and the coverages R of the respective dummy wirings 10 and 19 of each sample according to the present embodiment are shown together with the above-described $E_P$, $E_W$, $d_P$, and $d_W$. Further, S of the respective dummy wirings 10 and 19 formed by a square, in which the length of one side is a, is represented by $a^2/4a$. In addition, in a column of a CMP separation evaluation of Tables 1 to 6, a circle represents a result that there is no separation on the entire surface of a wafer, a triangle represents a result that there is a separation only in the end of the wafer (the edge portion), and a crisscross represents a result that there is a separation on the entire surface of the wafer.

First, as shown in Table 1, in the case that the coverage R of the dummy wiring 10 in the interlayer-insulator-film 5 of the (n+1)th layer is about 11%, assuming that the length a of one side of each dummy wiring 10 is about 0.4 μm or about 0.5 μm, the insulator film separation was not observed on the entire surface of a wafer 1. In addition, assuming that the length a of one side of each dummy wiring 10 is about 0.3 μm or about 0.6 μm, the insulator film separation was observed only on the edge portion of the wafer 1. Further, assuming that the length a of one side of each dummy wiring 10 is about 0.2 μm or less or about 0.7 μm or more, the insulator film separation was observed on the entire surface of the wafer 1.

TABLE 1

(n + 1)th layer, coverage R = 11%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 6.5 | 5.19 | 170 | 160 | 0.11 | 0.1 | 0.025 | X |
| ↓ | ↓ | ↓ | ↓ | ↓ | 0.2 | 0.050 | X |
|   |   |   |   |   | 0.3 | 0.075 | Δ |
|   |   |   |   |   | 0.4 | 0.100 | ○ |
|   |   |   |   |   | 0.5 | 0.125 | ○ |
|   |   |   |   |   | 0.6 | 0.150 | Δ |
|   |   |   |   |   | 0.7 | 0.175 | X |
|   |   |   |   |   | 0.8 | 0.200 | X |
|   |   |   |   |   | 0.9 | 0.225 | X |
|   |   |   |   |   | 1.0 | 0.250 | X |
|   |   |   |   |   | 1.5 | 0.375 | X |
|   |   |   |   | ↓ | 2.0 | 0.500 | X |

Next, as shown in Table 2, in the case that the coverage R of the dummy wiring 10 in the interlayer-insulator-film 5 of the (n+1)th layer is about 25%, assuming that the length a of one side of each dummy wiring 10 is about 0.5 μm or about 0.6 μm, the insulator film separation was not observed on the entire surface of the wafer 1. In addition, assuming that the length a of one side of each dummy wiring 10 is about 0.4 μm or about 0.7 μm or about 0.8 μm, the insulator film separation was observed only on the edge portion of the wafer 1. Further, assuming that the length a of one side of each dummy wiring 10 is about 0.3 μm or less or about 0.9 μm or more, the insulator film separation was observed on the entire surface of the wafer 1.

TABLE 2

(n + 1)th layer, coverage R = 25%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 6.5 | 5.19 | 170 | 160 | 0.25 | 0.1 | 0.025 | X |
| ↓ | ↓ | ↓ | ↓ | ↓ | 0.2 | 0.050 | X |
|   |   |   |   |   | 0.3 | 0.075 | X |
|   |   |   |   |   | 0.4 | 0.100 | Δ |
|   |   |   |   |   | 0.5 | 0.125 | ○ |
|   |   |   |   |   | 0.6 | 0.150 | ○ |
|   |   |   |   |   | 0.7 | 0.175 | Δ |
|   |   |   |   |   | 0.8 | 0.200 | Δ |
|   |   |   |   |   | 0.9 | 0.225 | X |
|   |   |   |   |   | 1.0 | 0.250 | X |
|   |   |   |   |   | 1.5 | 0.375 | X |
|   |   |   |   | ↓ | 2.0 | 0.500 | X |

Next, as shown in Table 3, in the case that the coverage R of the dummy wiring 10 in the interlayer-insulator-film 5 of the (n+1)th layer is about 44%, assuming that the length a of one side of each dummy wiring 10 is about 0.5 μm to about 0.8 μm, the insulator film separation was not observed on the entire surface of the wafer 1. In addition, assuming that the length a of one side of each dummy wiring 10 is about 0.9 μm or about 1.0 μm, the insulator film separation was observed only on the edge portion of the wafer 1. Further, assuming that the length a of one side of each dummy wiring 10 is about 0.4 μm or less or about 1.5 μm or more, the insulator film separation was observed on the entire surface of the wafer 1.

TABLE 3

(n + 1)th layer, coverage R = 44%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 6.5 | 5.19 | 170 | 160 | 0.44 | 0.1 | 0.025 | X |
| ↓ | ↓ | ↓ | ↓ | ↓ | 0.2 | 0.050 | X |
|   |   |   |   |   | 0.3 | 0.075 | X |
|   |   |   |   |   | 0.4 | 0.100 | X |
|   |   |   |   |   | 0.5 | 0.125 | ○ |
|   |   |   |   |   | 0.6 | 0.150 | ○ |
|   |   |   |   |   | 0.7 | 0.175 | ○ |
|   |   |   |   |   | 0.8 | 0.200 | ○ |
|   |   |   |   |   | 0.9 | 0.225 | Δ |
|   |   |   |   |   | 1.0 | 0.250 | Δ |
|   |   |   |   |   | 1.5 | 0.375 | X |
|   |   |   |   | ↓ | 2.0 | 0.500 | X |

Next, a range of S of the above-described formula (1) in the case that the coverage R of the dummy wiring 10 of the interlayer-insulator film 5 of the (n+1)th layer is about 11% will be obtained. For this purpose, a property value and a film thickness value of each material to configure the wiring structure of the (n+1)th layer are assigned into the above-described formulas (2) to (4).

As described above, the via layer 12 of the interlayer-insulator film 5 of the (n+1)th layer is formed by a two-layer stacked film formed by the SiC film 5a, of which Young's modulus is about 20 GPa and film thickness is about 35 nm, and the polymethyl siloxane film 5b, of which Young's modulus is about 3 GPa and film thickness is about 135 nm. These values are assigned into the above-described formulas (3) and (4). Then, a complex Young's modulus $E_C$ of the via layer 12 of the (n+1)th layer becomes about 6.5 GPa. In addition, the total film thickness $d_T$ of the via layer 12 becomes about 170 nm. In addition, the wiring layer 13 of the interlayer-insulator film 5 of the (n+1)th layer is formed by a two-layer stacked film formed by the porous $SiO_2$ film 5c, of which Young's modulus is about 3 GPa and film thickness is about 110 nm, and the SiOC film 5d, of which Young's modulus is about 10 GPa and film thickness is about 50 nm. These values are assigned into the above-described formulas (3) and (4). Then, the complex Young's modulus $E_C$ of the wiring layer 13 of the (n+1)th layer becomes about 5.19 GPa. In addition, the total film thickness $d_T$ of the wiring layer 13 becomes about 160 nm.

These values, the coverage R≈0.11, and the Young's modulus of the Cu film forming the effective wiring 8 of the (n+1)th layer of about 130 GPa are assigned into the above-described formula (2). Thereby, for the range of S in the case that the coverage R of the dummy wiring 10 in the interlayer-insulator-film 5 of the (n+1)th layer is about 11%, a relation of the following formula (5) is obtained.

$$0.069 < S < 0.17 \tag{5}$$

By comparing this formula (5) with the observation result of the insulator film separation shown in Table 1, it is known that the defect due to the insulator film separation on the place other than the end portion of the wafer 1 can be prevented in the case that the size of each dummy wiring 10 is determined so as to satisfy the relation of the formula (1). In addition, although the specific calculation is omitted, also in the case that the coverage R is about 25% and about 44%, it is known that the defect due to the insulator film separation on the place other than the end portion of the wafer 1 can be prevented in the case that the size of each dummy wiring 10 is determined so as to satisfy the relation of the formula (1).

Further, each value when the previously-obtained coverage R is about 11% is assigned into the following formula (6).

$$0.03 \times \left( \frac{E_P \times d_P + (E_W \times (1-R) + E_M \times R) \times d_W}{d_P + d_W} \right)^{0.4} < \tag{6}$$

$$S < 0.05 \times \left( \frac{E_P \times d_P + (E_W \times (1-R) + E_M \times R) \times d_W}{d_P + d_W} \right)^{0.4}$$

Then, for the range of S in the case that the coverage R of the dummy wiring 10 in the interlayer-insulator film 5 of the (n+1)th layer is about 11%, a relation of the following formula (7) is obtained.

$$0.082 < S < 0.14 \tag{7}$$

By comparing this formula (7) with the observation result of the insulator film separation shown in Table 1, it is known that the defect due to the insulator film separation on the entire surface of the wafer 1 can be prevented in the case that the size of each dummy wiring 10 is determined so as to satisfy the relation of the formula (6). In addition, although the specific calculation is omitted, also in the case that the coverage R is about 25% and about 44%, it is known that the defect due to the insulator film separation on the entire surface of the wafer 1 can be prevented in the case that the size of each dummy wiring 10 is determined so as to satisfy the relation of the formula (6).

Next, the respective samples shown in Tables 4 to 6 will be described. In the respective samples shown in these Tables 4 to 6, the wiring structure of the (n+2)th layer is formed with respect to a sample in which the defect due to the insulator film separation in the interlayer-insulator-film 5 of the (n+1)th layer is not observed among the respective samples shown in the above-described Tables 1 to 3.

First, as shown in Table 4, in the case that the coverage R of the dummy wiring 19 is about 11% in the interlayer-insulator-film 14 of the (n+2)th layer, assuming that the length of one side of the dummy wiring 19 is about 0.5 to 0.7 μm, the insulator film separation was not observed on the entire surface of the wafer 1. In addition, assuming that the length of one side of the dummy wiring 19 is about 0.4 μm, about 0.8 μm, or about 0.9 μm, the insulator film separation was observed only on the end portion of the wafer 1. In addition, assuming that the length a of one side of each dummy wiring 19 is about 0.3 μm or less or about 1.0 μm or more, the insulator film separation was observed on the entire surface of the wafer 1.

TABLE 4

(n + 2)th layer, coverage R = 11%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 26.07 | 14.56 | 280 | 225 | 0.11 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | Δ |
|  |  |  |  |  | 0.5 | 0.125 | ○ |
|  |  |  |  |  | 0.6 | 0.150 | ○ |
|  |  |  |  |  | 0.7 | 0.175 | ○ |
|  |  |  |  |  | 0.8 | 0.200 | Δ |
|  |  |  |  |  | 0.9 | 0.225 | Δ |
|  |  |  |  |  | 1.0 | 0.250 | X |
|  |  |  |  |  | 1.5 | 0.375 | X |
|  |  |  |  |  | 2.0 | 0.500 | X |

Next, as shown in Table 5, in the case that the coverage R of the dummy wiring 19 in the interlayer-insulator-film 14 of the (n+2)th layer is about 25%, assuming that the length a of one side of each dummy wiring 19 is about 0.5 μm to about 0.8 μm, the insulator film separation was not observed on the entire surface of the wafer 1. In addition, assuming that the length a of one side of each dummy wiring 19 is about 0.9 μm or about 1.0 μm, the insulator film separation was observed only on the edge portion of the wafer 1. Further, assuming that the length a of one side of each dummy wiring 19 is about 0.4 μm or less or about 1.5 μm or more, the insulator film separation was observed on the entire surface of the wafer 1.

TABLE 5

(n + 2)th layer, coverage R = 25%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 26.07 | 14.56 | 280 | 225 | 0.25 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | X |
|  |  |  |  |  | 0.5 | 0.125 | ○ |
|  |  |  |  |  | 0.6 | 0.150 | ○ |
|  |  |  |  |  | 0.7 | 0.175 | ○ |
|  |  |  |  |  | 0.8 | 0.200 | ○ |
|  |  |  |  |  | 0.9 | 0.225 | Δ |
|  |  |  |  |  | 1.0 | 0.250 | Δ |
|  |  |  |  |  | 1.5 | 0.375 | X |
|  |  |  |  |  | 2.0 | 0.500 | X |

Next, as shown in Table 6, in the case that the coverage R of the dummy wiring 19 in the interlayer-insulator-film 14 of the (n+2)th layer is about 44%, assuming that the length a of one side of each dummy wiring 19 is about 0.6 μm to about 0.9 μm, the insulator film separation was not observed on the entire surface of the wafer 1. In addition, assuming that the length a of one side of each dummy wiring 19 is about 0.5 μm or about 1.0 μm, the insulator film separation was observed only on the edge portion of the wafer 1. Further, assuming that the length a of one side of each dummy wiring 19 is about 0.4 μm or less or about 1.5 μm or more, the insulator film separation was observed on the entire surface of the wafer 1.

TABLE 6

(n + 2)th layer, coverage R = 44%

| $E_P$ (GPa) | $E_W$ (GPa) | $d_P$ (nm) | $d_W$ (nm) | R | a (μm) | S: $a^2$/4a (μm) | CMP peeling evaluation |
|---|---|---|---|---|---|---|---|
| 26.07 | 14.56 | 280 | 225 | 0.44 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | X |
|  |  |  |  |  | 0.5 | 0.125 | Δ |
|  |  |  |  |  | 0.6 | 0.150 | ○ |
|  |  |  |  |  | 0.7 | 0.175 | ○ |
|  |  |  |  |  | 0.8 | 0.200 | ○ |
|  |  |  |  |  | 0.9 | 0.225 | ○ |
|  |  |  |  |  | 1.0 | 0.250 | Δ |
|  |  |  |  |  | 1.5 | 0.375 | X |
|  |  |  |  |  | 2.0 | 0.500 | X |

Next, a range of S of the above-described formula (1) in the case that the coverage R of the dummy wiring 19 of the interlayer-insulator-film 14 of the (n+2)th layer is about 11% will be obtained. For this purpose, a property value and a film thickness value of each material to configure the wiring structure of the (n+2)th layer are assigned into the above-described formulas (2) to (4).

As described above, the via layer 21 of the interlayer-insulator-film 14 of the (n+2)th layer is formed by a two-layer stacked film formed by the SiCN film 14a, of which Young's modulus is about 100 GPa and film thickness is about 50 nm, and the SiOC film 14b, of which Young's modulus is about 10 GPa and film thickness is about 230 nm. These values are assigned into the above-described formulas (3) and (4). Then, a complex Young's modulus $E_C$ of the via layer 21 of the (n+2)th layer becomes about 26.07 GPa. In addition, the total film thickness $d_T$ of the via layer 21 becomes about 280 nm. In addition, the wiring layer 22 of the interlayer-insulator-film 14 of the (n+2)th layer is formed by the porous $SiO_2$ film 14c, of which Young's modulus is about 3 GPa and film thickness is about 175 nm, and the $SiO_2$ film 14d, of which Young's modulus is about 55 GPa and film thickness is about 50 nm. These values are assigned into the above-described formulas (3) and (4). Then, the complex Young's modulus $E_C$ of the wiring layer 22 of the (n+2)th layer becomes about 14.56 GPa. In addition, the total film thickness $d_T$ of the wiring layer 22 becomes about 225 nm.

These values, the coverage R≈0.11, and the Young's modulus of the Cu film forming the effective wiring 17 of the (n+2)th layer of about 130 GPa are assigned into the above-described formula (2). Thereby, for the range of S in the case that the coverage R of the dummy wiring 19 in the interlayer-insulator-film 14 of the (n+2)th layer is about 11%, a relation of the following formula (8) is obtained.

$$0.093 < S < 0.23 \quad (8)$$

By comparing this formula (8) with the observation result of the insulator film separation shown in Table 4, it is known that the defect due to the insulator film separation on the place other than the end portion of the wafer 1 can be prevented in the case that the size of each dummy wiring 19 is determined so as to satisfy the relation of the formula (1). In addition, although the specific calculation is omitted, also in the case that the coverage R is about 25% and about 44%, it is known that the defect due to the insulator film separation on the place other than the end portion of the wafer 1 can be prevented in the case that the size of each dummy wiring 19 is determined so as to satisfy the relation of the formula (1).

Further, each value when the previously-obtained coverage R is about 11% is assigned into the following formula (6). Then, for the range of S in the case that the coverage R of the dummy wiring 19 in the interlayer-insulator-film 14 of the (n+2)th layer is about 11%, a relation of the following formula (9) is obtained.

$$0.11 < S < 0.19 \quad (9)$$

By comparing this formula (9) with the observation result of the insulator film separation shown in Table 4, it is known that the defect due to the insulator film separation on the entire surface of the wafer 1 can be prevented in the case that the size of each dummy wiring 19 is determined so as to satisfy the relation of the formula (6). In addition, although the specific calculation is omitted, also in the case that the coverage R is about 25% and about 44%, it is known that the defect due to the insulator film separation on the entire surface of the wafer 1 can be prevented in the case that the size of each dummy wiring 19 is determined so as to satisfy the relation of the formula (6).

Generally, if the number of stacking of the wiring and the interlayer-insulator-film is increased in the multi-layer wiring structure, the defect due to the insulator film separation will be easily generated. In addition, in the case of embedding and forming the wiring in the respective interlayer-insulator-film, damage and a displacement given to the respective interlayer-insulator-films by the CMP step are accumulated and increased from the lower layer side toward the upper layer side. Therefore, in the multi-layer wiring structure, the defect due to the insulator film separation will be generated more easily at the upper layer side than at the lower layer side. Such a phenomenon is more remarkable in the case that the respective interlayer-insulator-films are formed by a low-relative-dielectric-constant-film than in the case that the respective interlayer-insulator-films are formed by a general insulator film such as a $SiO_2$ film. In addition, when the respective interlayer-insulator-films are formed by plural kinds of insulator films as in the present embodiment, as a ratio of a low-relative-dielectric-constant-film to configure the respective interlayer-insulator-films becomes larger, the phenomenon becomes remarkable.

However, according to the present embodiment, as described above, a plurality of the respective dummy wirings 10 and 19 having a size to satisfy the relation of the above-described formula (1) is aligned around the periphery of the effective wirings 8 and 17 for each wiring layer 13 and each wiring layer 22 of the respective interlayer-insulator-films 5 and 14 of the (n+1)th layer and the (n+2)th layer. Thereby, in the semiconductor device 1 according to the present embodiment, a defect due to the separation of the interlayer-insulator-film of the respective interlayer-insulator-films 5 and 14 in the CMP step is efficiently prevented, so that a yield is improved. In other words, the semiconductor device 1 according to the present embodiment has a high quality, a high performance, and a high reliability and has high production efficiency. Furthermore, in the semiconductor device 1 according to the present embodiment, a manufacturing cost is also restrained, so that a cost performance is improved. Particularly, in the case that the respective dummy wirings 10 and 19 having the sizes to satisfy the relation of the above-described formula (6) are aligned, these advantages are more enhanced.

Generally, when designing the wiring structure, a coverage of an effective wiring and a dummy wiring is decided so as to satisfy various factors such as a relative dielectric constant of an insulator film, restrictions in various processing steps including a lithography step, and restriction of erosion in CMP or the like. According to the present embodiment, for a coverage R that has been decided so as to satisfy these factors, the sizes of the respective dummy wirings 10 and 19 are selected so as to satisfy the above-described formula (1). Thereby, the above-described various factors can be satisfied and the semiconductor device 1 having a high tolerance against a boundary face separation among the insulator films 5a, 5b, 5c, 5d, 14a, 14b, 14c, and 14d with each other in the respective interlayer-insulator-films 5 and 14 can be designed. Further, the coverage R and the size of the respective dummy wirings 10 and 19 in the lower wiring layer 13 and the upper wiring layer 22 may be set at the same values if they are in the range satisfying the formula (1). Alternatively, the coverage R and the size of the respective dummy wirings 10 and 19 in the lower wiring layer 13 and the upper wiring layer 22 may be set at the different values with each other if they are in the range satisfying the formula (1). For example, the case of deciding the coverage R and the size of the respective dummy wirings 10 and 19 of the (n+1)th layer and the (n+2)th layer in the multi-layer wiring structure shown in FIG. 1 will be described below.

First, the coverage R and the size of the respective dummy wirings 10 of the (n+1)th layer will be decided. On the basis of the structure and the size of the effective wiring 8 to be aligned in the wiring layer 13 of the (n+1)th layer and a request such as restriction of erosion in the CMP step when embedding and forming the effective wiring 8 in the interlayer-insulator-film, the coverage R of the dummy wiring 10 of the (n+1)th layer will be derived. Here, it is assumed that the coverage R of the dummy wiring 10 of the (n+1)th layer needs to be set about 11% or more. On the other hand, according to a restriction such as the above-described relative-dielectric-constant of the insulator film, it is desirable that the coverage R is made as small as possible. Therefore, the coverage R of the dummy wiring 10 in the wiring layer 13 of the (n+1)th layer is set to be about 11%. On the basis of this setting, using the formula (1), the size of each dummy wiring 10 of the (n+1)th layer is set to be about 0.5 μm. Further, the size of each dummy wiring 10 may be set to be other than about 0.5 μm if it is in the range satisfying the formula (1).

Next, the coverage R and the size of the respective dummy wirings 19 of the (n+2)th layer will be decided. On the basis of the structure and the size of the effective wiring 17 to be aligned in the wiring layer 22 of the (n+2)th layer and a request such as restriction of erosion in the CMP step when embedding and forming the effective wiring 17 in the interlayer-insulator-film, the coverage R of the dummy wiring 19 of the (n+2)th layer will be derived. Here, it is assumed that the coverage R of the dummy wiring 19 of the (n+2)th layer needs to be set about 25% or more. As described above, according to a restriction such as the relative-dielectric-constant of the insulator film, it is desirable that the coverage R is made as small as possible. Therefore, the coverage R of the dummy wiring 19 in the wiring layer 22 of the (n+2)th layer is set to be about 25%. On the basis of this setting, using the formula (1), the size of each dummy wiring 19 of the (n+2)th layer is set to be about 0.5 μm. Further, the size of each dummy wiring 19 of the (n+2)th layer may be set to be other than about 0.5 μm if it is in the range satisfying the formula (1) similarly to the size of each dummy wiring 10 of the (n+1)th layer.

In this way, the coverage R and the size of the respective dummy wirings 10 and 19 of the (n+1)th layer and the (n+2)th layer are decided individually for the wiring layers 13 and 22 of the (n+1)th layer and the (n+2)th layer in the range satisfying the formula (1). In other words, with respect to the dummy wiring 10 of the (n+1)th layer, the coverage R is determined to be about 11% and the size is determined to be about 0.5 μm. Then, with respect to the dummy wiring 10 of the (n+2)th layer, the coverage R is determined to be about 25% and the size is determined to be about 0.5 μm. Thereby, without lowering a performance regarding the above-described relative-dielectric-constant of the insulator film, it is possible to improve the tolerance against a boundary face separation among the insulator films 5c, 5d, 14c, and 14d with each other in the respective interlayer-insulator-films 13 and 22 of the (n+1)th layer and the (n+2)th layer.

Further, in such a setting, together with the wiring layer 13 of the (n+1)th layer and the wiring layer 22 of the (n+2)th layer, the coverage R of the respective dummy wirings 10 and 19 may be standardized into about 25% and the size thereof may be standardized into about 0.5 μm. According to the experiment conducted by the inventors of the present invention, it has been known that there was little difference in the tolerance against the boundary face separation in the respective wiring layers 13 and 22 of the (n+1)th layer and the (n+2)th layer even if the coverage R and the size are determined in such a manner as long as they are in the range satisfying the formula (1). However, by increasing the coverage R of the dummy wiring 10 of the wiring layer 13 of the (n+1)th layer from about 11% to about 25% in accordance with the coverage R of the dummy wiring 19 of the wiring layer 22 of the (n+2)th layer, at least about the wiring layer 13 of the (n+1)th layer, a performance for a relative dielectric constant of an insulator film, restrictions in various processing steps including a lithography step, and restriction of erosion in the CMP or the like are lowered.

In addition, although the specific and detailed description referring to illustration is omitted, according to the experiment conducted by the inventors of the present invention, it has been known that, together with the wiring layer 13 of the (n+1)th layer and the wiring layer 22 of the (n+2)th layer, the nearest distances $X_1$ and $X_2$ between the respective effective wirings 8, 17 and the respective dummy wirings 10, 19 are preferably set in the range of about 250 μm or less. Particularly, it has been known that an effect to prevent the insulator film separation in the respective wiring layers 13 and 22 of the (n+1)th layer and the (n+2)th layer is more enhanced by setting the nearest distances $X_1$ and $X_2$ between the respective effective wirings 8, 17 and the respective dummy wirings 10, 19 to be about 5 μm or less.

As described above, according to this first embodiment, it is possible to obtain the semiconductor device 1 having a multi-wiring structure, wherein interlayer-insulator-film 3, 5, and 14, in which at least a part thereof is formed by low-relative-dielectric-constant-films 3a, 5b, 5c, 5d, 14b, and 14c are stacked in three layers from the nth layer to the (n+2)th layer to be arranged on a semiconductor substrate 2; the respective effective wirings 8 and 17 are arranged contacting the respective low-relative-dielectric-constant-films 5b, 5c, 5d, 14b, and 14c in the respective interlayer-insulator-films 5 and 14 of the (n+1)th layer and the (n+2)th layer among these respective interlayer-insulator-films 3, 5, and 14; and in the respective wiring layers 13 and 22 in which these respective effective wirings 8 and 17 are arranged, the respective dummy wirings 10 and 19 are arranged surrounding the periphery of the respective effective wirings 8 and 17 contacting the respective low-relative-dielectric-constant-films 5b, 5c, 5d, 14b, and 14c. Then, in this semiconductor device 1, for each wiring layer 13 and each wiring layer 22, on which the respective effective wirings 8 and 17 and the respective dummy wirings 10 and 19 are provided, not only the coverages R of the respective dummy wirings 10 and 19 but also the sizes of the respective dummy wirings 10 and 19 are optimized in consideration of the mechanical property values of the respective interlayer-insulator-films 5 and 14. Thereby, the boundary face separation of the insulator film in the CMP step when embedding and forming the respective effective wirings 8 and 17 in the interlayer-insulator-film is efficiently prevented. Further, also in the interlayer-insulator-film 3 of the nth layer, similarly to the respective dummy wirings 10 and 19 on which the (n+1)th layer and (n+2)th layer are provided, the dummy wiring may be formed by appropriately setting the size, the shape, the arrangement or the like in accordance with its coverage.

Second Embodiment

Next, a second embodiment according to the present invention will be described with reference to FIG. 4. The same reference marks are given to the same parts as the above-described first embodiment and the detailed description thereof is omitted.

According to the present embodiment, a multi-layer structure in which a wiring structure for one more layer is added to the multi-layer structure of the semiconductor device 1 according to the first embodiment and a manufacturing method thereof will be described. Hereinafter, the present embodiment will be specifically explained in detail.

Figure 4:
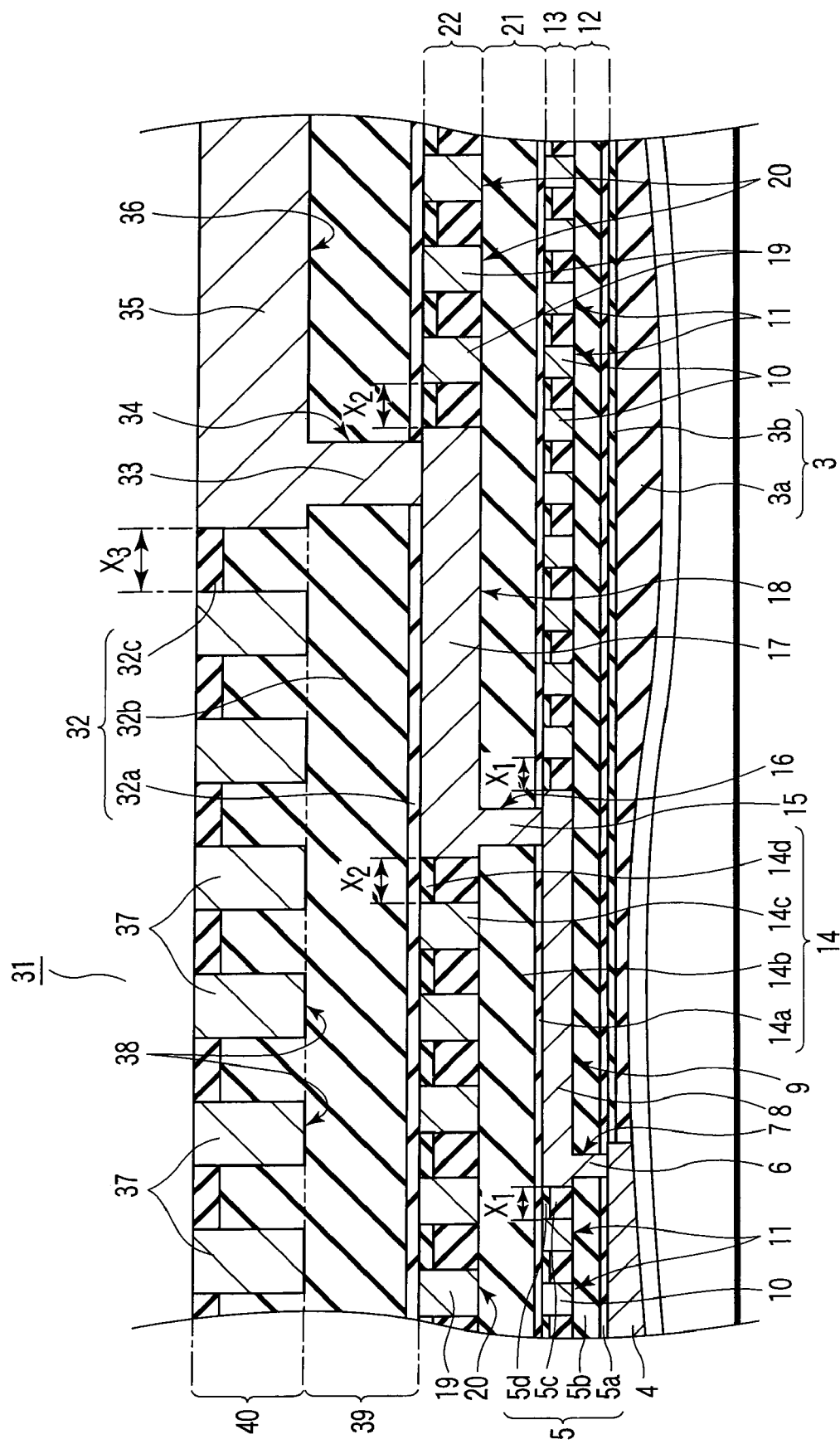
FIG. 4 is a cross sectional view showing a semiconductor device according to a second embodiment.

First, as shown in FIG. 4, in a semiconductor device 31 according to the present embodiment, the layers from the nth layer to the (n+2)th layer are manufactured by the same method as the manufacturing method of the semiconductor device 1 according to the first embodiment. Differently from FIG. 1, in FIG. 4, the respective dummy wirings 19 of the (n+2)th layer are illustrated by plural pieces on the right and left sides of the effective wiring 17.

Next, the wiring structure of the (n+3)th layer of the semiconductor device 31 will be formed. Specifically, first, on the interlayer-insulator-film 14 of the (n+2)th layer in which the via plug 15, the effective wiring 17, and the respective dummy wirings 19 of the (n+2)th layer are embedded and formed, an interlayer-insulator-film 32 of the (n+3)th layer is arranged. In this case, differently from the respective interlayer-insulator-films 5 and 14 of the (n+1)th layer and the (n+2)th layer, this interlayer-insulator-film 32 of the (n+3)th layer is formed into a three-layer structure formed by a first insulator film 32a, a second insulator film 32b, and a third insulator film 32c from the lower side to the upper side.

First, covering the surfaces of the SiO₂ film 14d that is an insulator film of the top layer of the interlayer-insulator-film 14 of the (n+2)th layer, the effective wiring 17, and the respective dummy wirings 19, as the first insulator film, a silicon nitride (SiN) film 32a that is a general insulator film is deposited with a film thickness of about 50 nm by a plasma CVD method. Similarly to the above-described SiC film 5a of the (n+1)th layer and the above-described SiCN film 14a of the (n+2)th layer, this SiN film 32a may function as an etching stopper film to prevent the SiO₂ film 14d, the effective wiring 17, and the respective dummy wirings 19 from being etched when forming a via hole 34 of the (n+3)th layer to be described later in the interlayer-insulator-film 32 of the (n+3)th layer. In addition, similarly to the SiCN film 14a of the (n+2)th layer, the SiN film 32a has a high Young's modulus of about 100 GPa. Therefore, similarly to the SiC film 5a and the SiCN film 14a, the SiN film 32a may also function as a reinforcement film to prevent a via plug 33 of the (n+3)th layer to be provided in the via hole 34 and be described later from being displaced by the CMP step when embedding a wiring 35 of the (n+3)th layer to be connected to the via plug 33 and be described later in the interlayer-insulator-film 32 of the (n+3)th layer or from being separated from the effective wiring 17 of the (n+2)th layer by holding the via plug 33.

Then, on the SiN film 32a, as the second insulator film, a fluorine (F)-doped SiO₂ film (F doped SiO₂ film) 32b is formed with a film thickness of about 910 nm by the plasma CVD method. This F doped SiO₂ film 32b is a general insulator film and its Young's modulus is about 36 GPa. Then, on this F doped SiO₂ film 32b, as the third insulator film, the SiO₂ film 32c that is a general insulator film is formed with a film thickness of about 100 nm by the plasma CVD method. This SiO₂ film 32c of the (n+3)th layer has also a relative-dielectric-constant of about 4.0 and has a Young's modulus of about 55 GPa similarly to the above-described SiO₂ film 32b of the n-th layer and the SiO₂ film 14d of the (n+2)th layer.

According to these steps, the interlayer-insulator-film 32 of the (n+3)th layer formed by a three-layer complex insulator film including the SiN film 32a, the F doped SiO₂ film 32b, and the SiO₂ film 32c, of which film qualities and film kinds are different from each other, is deposited on the interlayer-insulator film 14 of the (n+2)th layer. In other words, differently from the respective interlayer-insulator-films 3, 5, and 14 from the nth layer to the (n+2)th layer, of which at least a part is formed by the low-relative-dielectric-constant-films 3a, 5b, 5c, 5d, 14b, and 14c, all layers of this interlayer-insulator-film 32 of the (n+3)th layer are formed by general insulator films.

Next, the via plug 33 of the (n+3)th layer to be connected to the upper part of the effective wiring 17 of the (n+2)th layer and the wiring (the effective wiring) 35 of the (n+3)th layer to be connected to the upper part of the via plug 33 are arranged within the interlayer-insulator-film 32 of the (n+3)th layer. Therewith, the reinforcement member (the dummy wiring) 37 of the (n+3)th layer is arranged within the interlayer-insulator-film 32 of the (n+3)th layer. These via plug 33, effective wiring 35, and dummy wiring 37 of the (n+3)th layer may be formed by the same method as that for forming the respective via plugs 6 and 15, the respective effective wirings 8 and 17, and the respective dummy wirings 10 and 19 of the (n+1)th layer and the (n+2)th layer. Hereinafter, this will be briefly described.

First, at the position of the upper part of the effective wiring 17 of the (n+2)th layer where the via plug 33 is arranged, by eliminating the SiO₂ film 32c and the F-doped SiO₂ film 32b along their film thickness directions by the RIE method until the upper face of the SiCN film 32a is exposed, a hole is formed (not illustrated). Then, at the position of the upper part of the hole where the effective wiring 35 is arranged, the SiO₂ film 32c and the F-doped SiO₂ film 32b are eliminated along their film thickness directions by the RIE method until they reach a middle portion in a height direction of the F-doped SiO₂ film 32b. Here, the F-doped SiO₂ film 32b is eliminated from its upper face up to the depth of about 400 nm. Thereby, a wiring groove (an effective wiring groove) 36 for arranging the effective wiring 35 of the (n+3)th layer of a depth of about 500 nm is formed within the SiO₂ film 32c and the F-doped SiO₂ film 32b being communicated with the upper part of the hole.

In addition, in parallel with forming of the effective wiring groove 36, at plural positions surrounding the periphery of the effective wiring groove 36, the SiO₂ film 32c and the F-doped SiO₂ film 32b are eliminated with approximately the same depth as that of the effective wiring groove 36 along their film thickness directions by the RIE method. Thereby, dummy wiring grooves (grooves for a reinforcement member) 38 for arranging the dummy wiring 37 of the (n+3)th layer are formed at plural positions in the SiO₂ film 32c and the F-doped SiO₂ film 32b with approximately the same height as that of the effective wiring groove 36 and with approximately the same depth of about 500 nm as that of the effective wiring groove 36.

Similarly to the respective dummy wiring grooves 11 of the (n+1)th layer and the respective dummy wiring grooves 20 of the (n+2)th layer, the respective dummy wiring grooves 38 of the (n+3)th layer are separated from the effective wiring groove 36 by at least a predetermined interval $X_3$ surrounding the periphery of the effective wiring groove 36. In this case, the interval $X_3$ is set to be about 2 μm similarly to the interval $X_1$ between the effective wiring groove 9 and the respective dummy wirings 11 of the (n+1)th layer and the interval $X_2$ between the effective wiring groove 18 and the respective dummy wirings 20 of the (n+2)th layer. Further, in FIG. 4, only the respective dummy wiring grooves 38 that are formed on the left side of the effective wiring groove 36 among a plurality of dummy wiring grooves 38 are illustrated. After this, by eliminating the SiN film 32a on the lower part of the hole by the RIE method, the upper face of the effective wiring 17 of the (n+2)th layer is exposed. Thereby, the via hole 34 for providing the via plug 33 of the (n+3)th layer is formed in the F-doped $SiO_2$ film 32b and the SiN film 32a to be communicated with the lower part of the effective wiring groove 36.

Next, the barrier metal layer of the (n+3)th layer (not illustrated) is entirely deposited on the surface under an atmosphere of about 150° C. by the sputtering method, covering inner faces of the via hole 34, the effective wiring groove 36, and the respective dummy wiring grooves 38, the surface of the effective wiring 17 of the (n+2)th layer that is exposed by the via hole 34, the surface of the $SiO_2$ film 32c that is a film of the top layer of the interlayer-insulator-film 32 of the (n+3)th layer and the like. Then, filling insides of the via hole 34, the effective wiring groove 36, and the respective dummy wiring grooves 38 on which the barrier metal layer of the (n+3)th layer is arranged, by the sputtering method and the electrolytic plating method, the Cu film of the (n+3)th layer is deposited on the entire surface of the barrier metal layer of the (n+3)th layer. The Young's modulus of this Cu film of the (n+3)th layer is also about 130 GPa similarly to those of the above-described and Cu film of the (n+1)th and (n+2)th layers. Then, the anneal processing is applied to the Cu film of the (n+3)th layer under the same condition as the Cu films of the (n+1)th layer and the (n+2)th layer. After this, unnecessary barrier metal layer and Cu film is polished and eliminated by the CMP method, which are arranged outsides of the via hole 34, the effective wiring groove 36, and the respective dummy wiring grooves 38. Thereby, the via plug 33, the effective wiring 35, and the respective dummy wirings 37, of which side part and bottom part are covered with the barrier metal layer, are embedded and formed in the interlayer-insulator-film 32 of the (n+3)th layer in parallel.

In this way, differently from the respective via plugs 6 and 15, the respective effective wirings 8 and 17, and the respective dummy wirings 10 and 19 of the (n+1)th layer and the (n+2)th layer, the via plug 33, the effective wiring 35, and the respective dummy wirings 37 of the (n+3)th layer are arranged within general insulator films 32a, 32b, and 32c, all of them not contacting the low-relative-dielectric-constant-film. The effective wiring 35 is arranged with its upper part located in the $SiO_2$ film 32c and its lower part located in the F-doped $SiO_2$ film 32b. In addition, the effective wiring 35 is formed as a dual damascene wiring having a lower part to which the via plug 33 is connected integrally similarly to the respective effective wirings 8 and 17 of the (n+1)th layer and the (n+2)th layer. The via plug 33 is arranged with its upper part located in the F-doped $SiO_2$ film 32b and its lower part located in the SiN film 32a.

In addition, as shown in FIG. 4, the respective dummy wirings 37 of the (n+3)th layer are provided being electrically cut from the effective wiring 35 and the via plug 33. In practice, a plurality of the respective dummy wirings 37 is separated from the effective wiring 35 by at least 2 μm surrounding the periphery of the effective wiring 35; however, in FIG. 4, only the respective dummy wirings 37 provided on the left side of the effective wiring 35 are illustrated. In addition, similarly to the effective wiring 35, these respective dummy wirings 37 are arranged with their upper parts located in the $SiO_2$ film 32c and their lower parts located in the F-doped $SiO_2$ film 32b.

In addition, the effective wiring 35 of the (n+3)th layer may configure an actual energizing path of the semiconductor device 31 together with the via plug 33 of the (n+3)th layer that is formed to be integrated with the effective wiring 35, the effective wiring 17 and the via plug 15 of the (n+2)th layer that are indirectly connected to the effective wiring 35 via this via plug 33, the effective wiring 8 and the via plug 6 of the (n+1)th layer indirectly connected via the via plug 15 and the effective wiring 4 of the n-th layer. On the contrary, similarly to the respective dummy wirings 10 and 19 of the (n+1)th layer and the (n+2)th layer, the respective dummy wirings 37 of the (n+3)th layer does not configure the actual energizing path of the semiconductor device 31.

According to these steps, the wiring structure of the (n+3)th layer of the semiconductor device 31 is formed. In other words, the semiconductor device 31 according to the present embodiment having a multi-layer wiring structure shown in FIG. 4 is obtained. Further, setting of the sizes, the shapes, or the arrangements of the respective dummy wirings 37 of the (n+3)th layer is the same as setting of the sizes, the shapes, or the arrangements of the respective dummy wirings 10 and 19 of the (n+1)th layer and the (n+2)th layer. In addition, the SiN film 32a where the via plug 33 of the interlayer-insulator-film 32 of the (n+3)th layer is formed and that part of the F-doped $SiO_2$ film 32b to the height about 510 nm from a boundary face between the SiN film 32a where the via plug 33 is formed may be collectively referred to as the via layer of the (n+3)th layer or a plug layer 39. In the same way, the $SiO_2$ film 32c where the effective wiring 35 and the dummy wiring 37 are formed in the interlayer-insulator-film 32 of the (n+3)th layer and that part of the F-doped $SiO_2$ film 32b to the depth of about 400 nm from a boundary face between the $SiO_2$ film 32c where the effective wiring 35 and the dummy wiring 37 are formed may be collectively referred to as the wiring layer 40 of the (n+3)th layer.

Next, a plurality of samples manufactured by the inventors of the present invention on the basis of the above-described present embodiment will be described with reference to Tables 7 to 9. These respective samples according to the present embodiment are manufactured on the basis of the same setting as that of the respective samples of the first embodiment. Then, for each sample manufactured on the basis of such a setting, presence/absence of the insulator film separation of the interlayer-insulator-film 32 of the (n+3)th layer after the effective wiring 35 of the (n+3)th layer is embedded and formed in the interlayer-insulator-film by the CMP method is observed by using an optical microscope. The observation results for these interlayer-insulator-film 32 of the (n+3)th layer are shown in Tables 7 to 9.

First, as shown in Table 7, in the case that the coverage R of the dummy wiring 37 in the interlayer-insulator-film 32 of the (n+3)th layer is about 11%, assuming that the length a of one side of each dummy wiring 37 is about 0.6 μm or about 0.9 μm, the insulator film separation was not observed on the entire surface of a wafer 31. In addition, assuming that the length a of one side of each dummy wiring 37 is about 0.5 μm or about 1.0 μm, the insulator film separation was observed only on the edge portion of the wafer 31. Further, assuming that the length a of one side of each dummy wiring 37 is about 0.4 μm or less or about 1.5 μm or more, the insulator film separation was observed on the entire surface of the wafer 31.

TABLE 7

(n + 3)th layer, coverage R = 11%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 41.71 | 39.8 | 560 | 500 | 0.11 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | X |
|  |  |  |  |  | 0.5 | 0.125 | Δ |
|  |  |  |  |  | 0.6 | 0.150 | ○ |
|  |  |  |  |  | 0.7 | 0.175 | ○ |
|  |  |  |  |  | 0.8 | 0.200 | ○ |
|  |  |  |  |  | 0.9 | 0.225 | ○ |
|  |  |  |  |  | 1.0 | 0.250 | Δ |
|  |  |  |  |  | 1.5 | 0.375 | X |
|  |  |  |  |  | 2.0 | 0.500 | X |

Next, as shown in Table 8, in the case that the coverage R of the dummy wiring 37 in the interlayer-insulator-film 32 of the (n+3)th layer is about 25%, assuming that the length a of one side of each dummy wiring 37 is about 0.6 μm or about 0.9 μm, the insulator film separation was not observed on the entire surface of the wafer 31. In addition, assuming that the length a of one side of each dummy wiring 37 is about 0.5 μm or about 1.0 μm, the insulator film separation was observed only on the edge portion of the wafer 31. Further, assuming that the length a of one side of each dummy wiring 37 is about 0.4 μm or less or about 1.5 μm or more, the insulator film separation was observed on the entire surface of the wafer 31.

TABLE 8

(n + 3)th layer, coverage R = 25%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 41.71 | 39.8 | 560 | 500 | 0.25 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | X |
|  |  |  |  |  | 0.5 | 0.125 | Δ |
|  |  |  |  |  | 0.6 | 0.150 | ○ |
|  |  |  |  |  | 0.7 | 0.175 | ○ |
|  |  |  |  |  | 0.8 | 0.200 | ○ |
|  |  |  |  |  | 0.9 | 0.225 | ○ |
|  |  |  |  |  | 1.0 | 0.250 | Δ |
|  |  |  |  |  | 1.5 | 0.375 | X |
|  |  |  |  |  | 2.0 | 0.500 | X |

Next, as shown in Table 9, in the case that the coverage R of the dummy wiring 37 in the interlayer-insulator-film 32 of the (n+3)th layer is about 44%, assuming that the length a of one side of each dummy wiring 37 is about 0.7 μm to about 1.0 μm, the insulator film separation was not observed on the entire surface of the wafer 31. In addition, assuming that the length a of one side of each dummy wiring 37 is about 0.6 μm, the insulator film separation was observed only on the edge portion of the wafer 31. Further, assuming that the length a of one side of each dummy wiring 37 is about 0.5 μm or less or about 1.5 μm or more, the insulator film separation was observed on the entire surface of the wafer 31.

TABLE 9

(n + 3)th layer, coverage R = 44%

| $E_P$ (GPa) | $E_W$ (GPa) | $d_P$ (nm) | $d_W$ (nm) | R | a (μm) | S: $a^2$/ 4a (μm) | CMP peeling evaluation |
|---|---|---|---|---|---|---|---|
| 41.71 | 39.8 | 560 | 500 | 0.44 | 0.1 | 0.025 | X |
| ↓ | ↓ | ↓ | ↓ | ↓ | 0.2 | 0.050 | X |
|  |  |  |  |  | 0.3 | 0.075 | X |
|  |  |  |  |  | 0.4 | 0.100 | X |
|  |  |  |  |  | 0.5 | 0.125 | X |
|  |  |  |  |  | 0.6 | 0.150 | Δ |
|  |  |  |  |  | 0.7 | 0.175 | ○ |
|  |  |  |  |  | 0.8 | 0.200 | ○ |
|  |  |  |  |  | 0.9 | 0.225 | ○ |
|  |  |  |  |  | 1.0 | 0.250 | ○ |
|  |  |  |  |  | 1.5 | 0.375 | X |
|  |  |  |  |  | 2.0 | 0.500 | X |

Next, a range of S of the above-described formula (1) in the case that the coverage R of the dummy wiring 37 of the interlayer-insulator-film 32 of the (n+3)th layer is about 11% will be obtained. For this purpose, a property value and a film thickness value of each material to configure the wiring structure of (n+3)th layer are assigned into the above-described formulas (2) to (4).

As described above, the via layer 39 of the interlayer-insulator-film 32 of the (n+3)th layer is formed by a two-layer stacked film formed by the SiN film 32a, of which Young's modulus is about 100 GPa and film thickness is about 50 nm, and the part having a lower part with a film thickness of about 510 nm of the F-doped SiO$_2$ film 32b, of which Young's modulus is about 36 GPa and film thickness is about 910 nm. These values are assigned into the above-described formulas (3) and (4). Then, a complex Young's modulus $E_C$ of the via layer 39 of the (n+3)th layer becomes about 41.71 GPa. In addition, the total film thickness $d_T$ of the via layer 39 becomes about 560 nm. In addition, the wiring layer 40 of the interlayer-insulator-film 32 of the (n+3)th layer is formed by a two-layer stacked film formed by the part having an upper part with a film thickness of about 400 nm of the F-doped SiO$_2$ film 32b, of which Young's modulus is about 36 GPa and film thickness is about 910 nm, and the SiO$_2$ film 32c, of which Young's modulus is about 55 GPa and film thickness is about 100 nm. These values are assigned into the above-described formulas (3) and (4). Then, the complex Young's modulus $E_C$ of the wiring layer 40 of the (n+3)th layer becomes about 39.8 GPa. In addition, the total film thickness $d_T$ of the wiring layer 40 becomes about 500 nm.

These values, the coverage R≈0.11, and the Young's modulus of the Cu film forming the effective wiring 35 of the (n+3)th layer of about 130 GPa are assigned into the above-described formula (2). Thereby, for the range of S in the case that the coverage R of the dummy wiring 37 in the interlayer-insulator-film 32 of the (n+3)th layer is about 11%, a relation of the following formula (10) is obtained.

$$0.12 < S < 0.29 \quad (10)$$

By comparing this formula (10) with the observation result of the insulator film separation shown in Table 7, it is known that the defect due to the insulator film separation on the place other than the end portion of the wafer 31 can be prevented in the case that the size of each dummy wiring 37 is determined so as to satisfy the relation of the formula (1). In addition, although the specific calculation is omitted, also in the case that the coverage R is about 25% and about 44%, it is known that the defect due to the insulator film separation on the place other than the end portion of the wafer 31 can be prevented in the case that the size of each dummy wiring 37 is determined so as to satisfy the relation of the formula (1).

Further, each value when the previously-obtained coverage R is about 11% is assigned into the following formula (6). Then, for the range of S in the case that the coverage R of the dummy wiring 37 in the interlayer-insulator-film 32 of the (n+3)th layer is about 11%, a relation of the following formula (11) is obtained.

$$0.14 < S < 0.23 \quad (11)$$

By comparing this formula (11) to the observation result of the insulator film separation shown in Table 7, it is known that the defect due to the insulator film separation on the entire surface of the wafer 31 can be prevented in the case that the size of each dummy wiring 37 is determined so as to satisfy the relation of the formula (6). In addition, although the specific calculation is omitted, also in the case that the coverage R is about 25% and about 44%, it is known that the defect due to the insulator film separation on the entire surface of the wafer 31 can be prevented in the case that the size of each dummy wiring 37 is determined so as to satisfy the relation of the formula (6).

As described above, according to this second embodiment, in the multi-layer wiring structure in which a wiring structure is further stacked on the wiring structure, in which an interlayer-insulator-film is formed by a low-relative-dielectric-constant-film, even in the case that the interlayer-insulator-film of the upper layer, in which a defect due to the insulator film separation is easily generated by accumulation of damage and displacement, is formed by a general insulator film, the same advantage as that of the above-described first embodiment can be obtained. In addition, also in the semiconductor device 31 according to the present embodiment having a multi-layer wiring structure in which the insulator films 5c, 5d, 14c, 14d, 32b, and 32c configuring the respective wiring layers 13, 22, and 40 of the (n+1)th layer, the (n+2)th layer, and the (n+3)th layer are different for each of the respective interlayer-insulator-films 5, 14, and 32 of the (n+1)th layer, the (n+2)th layer, and the (n+3)th layer, by aligning the dummy wirings 10, 19, and 37 having the sizes to satisfy the formula (1) for each of these respective wiring layers 13, 22, and 40 surrounding the periphery of the respective effective wirings 8, 17, and 35, a defect due to an insulator film separation in the CMP step each of the respective wiring layers 13, 22, and 40 is efficiently prevented, so that a yield is improved.

Accordingly, the semiconductor device 31 according to the present embodiment has a high quality, a high performance, a high reliability and high product efficiency although it has the multi-layer wiring structure. Furthermore, in the semiconductor device 31 according to the present embodiment, a manufacturing cost is also restrained, so that a cost performance is improved. Particularly, in the case that the respective dummy wirings 10, 19, and 37 having the sizes to satisfy the relation of the above-described formula (6) are aligned, these advantages are more enhanced.

Third Embodiment

Next, a third embodiment according to the present invention will be described with reference to FIGS. 5A to 5E. The same reference marks are given to the same parts as the above-described first and second embodiments and the detailed description thereof is omitted.

According to the present embodiment, variations of the shapes of the respective dummy wirings 10, 19, and 37 of the above-described (n+1)th layer to the (n+3)th layer will be briefly described.

In each of the first and second embodiments, it is determined that the respective dummy wirings 10, 19, and 37 of the (n+1)th layer to the (n+3)th layer are formed in a square in which a length of one side is a. However, the shapes of these respective dummy wirings 10, 19, and 37 are not limited to a square.

Figure 5A:
FIGS. 5A, 5B, 5C, 5D, and 5E are plan views showing a dummy wiring according to a third embodiment as seen from above.
Figure 5B:
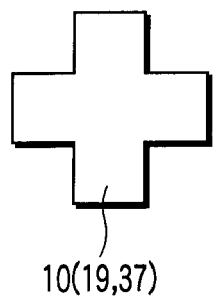
Figure 5C:
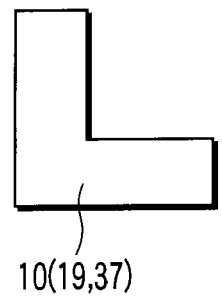
Figure 5D:
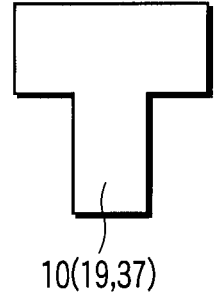
Figure 5E:
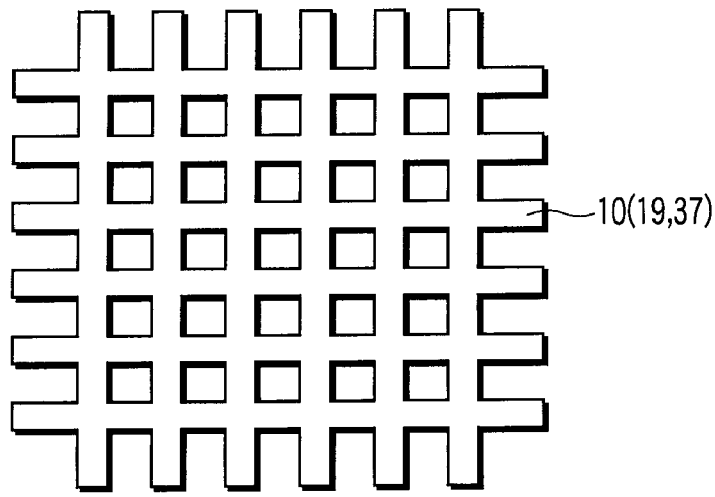

For example, as shown in FIG. 5A, the respective dummy wirings 10, 19, and 37 may be formed so that the planar shapes thereof are rectangles. In addition, as shown in FIG. 5B, the respective dummy wirings 10, 19, and 37 may be formed into a cross-shape. Further, as shown in FIG. 5C, the respective dummy wirings 10, 19, and 37 may be formed so that the planar shapes thereof are L-shapes or key-shapes. In addition, as shown in FIG. 5D, the respective dummy wirings 10, 19, and 37 may be formed so that the planar shapes thereof are T-shapes. Further, as shown in FIG. 5E, the respective dummy wirings 10, 19, and 37 may be formed so that the planar shapes thereof are mesh-like shapes, comb-like shapes, shelf-like shapes, or fence-like shapes.

Further, as described above, boundary lengths of the respective dummy wirings 10, 19, and 37 are defined by a sum of the lengths of boundary faces between the upper faces of the respective interlayer-insulator films 5, 14, and 32 (insulator films 5d, 14d, and 32c) on which the respective dummy wirings 10, 19, and 37 are arranged and the exposed faces of the respective dummy wirings 10, 19, and 37 for these upper faces. As a result, in the case that the respective dummy wirings 10, 19, and 37 are formed in mesh-like shapes as shown in FIG. 5E, for example, the boundary lengths of the respective dummy wirings 10, 19, and 37 include not only the length of the boundary face between the external periphery parts of the respective dummy wirings 10, 19, and 37 and the respective interlayer-insulator-films 5, 14, and 32 but also the length of the boundary face between the internal periphery parts of the respective dummy wirings 10, 19, and 37 and the respective interlayer-insulator-films 5, 14, and 32 that are confined inside the respective dummy wirings 10, 19, and 37.

As described above, according to this third embodiment, it is also possible to obtain the same advantage as the above-described first and second embodiments. In addition, according to this third embodiment, the shapes of the respective dummy wirings 10, 19, and 37 can be freely designed in accordance with the shapes, the alignment patterns or the like of the respective effective wirings 8, 17, and 35, so that it is possible to enhance a degree of freedom of the entire semiconductor device. It is obvious that the shapes of the respective dummy wirings 10, 19, and 37 may be formed into a different shape for each dummy pattern forming area that is set to be divided into plural areas for each layer or in the same layer.

Furthermore, although the specific and detailed description referring to illustration is omitted, a columnar or a fence-like (a groove-like) shaped dummy via plug may be connected to the lower parts of the respective wrings 10, 19, and 37. Then, it is better that these respective dummy via plugs are configured in such a manner that at least a part of each of these respective dummy via plugs contacts the SiC film 5a of the (n+1)th layer, the SiCN film 14a of the (n+2)th layer, or the SiN film 32a of the (n+3)th layer that function as a reinforcement layer similarly to the respective via plugs 6, 15, and 33 from the (n+1)th layer to the (n+3)th layer. Due to such a configuration, it is possible to prevent a defect due to an insulation film separation in the CMP step more efficiently for each of the respective wiring layers 13, 22, and 40.

Further, the semiconductor device according to the present invention is not limited to the above-described first to third the respective embodiments. The present invention can be put into practice by variously modifying the configurations or some parts of the manufacturing steps of these embodiments or the like or arbitrarily combining the respective settings without departing from the scope of the invention.

For example, the insulator film to form the interlayer-insulator film 5 of the (n+1)th layer is not limited to the above-described SiC film 5a, polymethyl siloxane film 5b, porous SiO$_2$ film 5c, and SiOC film 5d. The interlayer-insulator-film 5 may be formed by using a fluorine (F)-doped SiO$_2$ film, an organic insulator film, a hydrogen silsesquioxane film, a polymeric film, a F-doped amorphous carbon film, or a stacking film having at least two kinds of these films stacked therein. In addition, it is not necessary to form the interlayer-insulator film 5 of the (n+1)th layer into a four-layer structure using four kinds of insulator films 5a, 5b, 5c, and 5d, of which film kinds are different from each other as described above. For example, in the interlayer-insulator film 5 of the (n+1)th layer, two or more layers among these four layers of insulator films 5a, 5b, 5c, and 5d may be formed by using one kind of insulator film. Alternatively, in the interlayer-insulator film 5 of the (n+1)th layer, at least one layer among these four layers of insulator films 5a, 5b, 5c, and 5d may be formed by using a stacking film including two kind or more of insulator films, of which film kinds are different from each other.

In the same way, it is not necessary to form the interlayer-insulator-film 14 of the (n+2)th layer into a four-layer structure using the SiCN film 14a, the SiOC film 14b, the porous SiO$_2$ film 14c, and the SiO$_2$ film 14d, of which film kinds are different from each other as described above. Also in the interlayer-insulator-film 14 of the (n+2)th layer, similarly to the interlayer-insulator film 5 of the (n+1)th layer, two or more layers among these four layers of insulator films 14a, 14b, 14c, and 14d may be formed by using one kind of insulator film. Alternatively, in the interlayer-insulator-film 14 of the (n+2)th layer, at least one layer among these four layers of insulator films 14a, 14b, 14c, and 14d may be formed by using a stacking film including two kind or more of insulator films, of which film kinds are different from each other.

In addition, among four layers of the insulator films 14a, 14b, 14c, and 14d to configure the interlayer-insulator-film 14 of the (n+2)th layer, for example, the first insulator film needs not to be formed by using the above-described SiCN film 14a. The first insulator film in the interlayer-insulator-film 14 of the (n+2)th layer may be formed by using a silicon nitride film (a SiN film) to be formed by the plasma CVD method, for example. In addition, among four layers of the insulator films 14a, 14b, 14c, and 14d to configure the interlayer-insulator-film 14 of the (n+2)th layer, for example, the third insulator film also needs not to be formed by using the above-described porous SiO$_2$ film 14c. Further, the third insulator film of the interlayer-insulator-film 14 of the (n+2)th layer may be formed by using a polymethyl siloxane film, for example.

Furthermore, the SiC film 5a of the (n+1)th layer, the SiCN film 14a of the (n+2)th layer, and the SiN film 32a of the (n+3)th layer, which function not only as an etching stopper but also as a reinforcement layer, needs not to be formed on the lower layer sides of the respective via layers 12, 21, and 39, that are the first layers (the bottom layers) of the respective layers. These respective films 5a, 14a, and 32a may be formed on the top layers of via layers 12, 21, and 39 of the respective layers, for example. That is, the respective films 5a, 14a, and 32a may be formed at the position contacting the upper parts of each layer of the via plugs 6, 15, and 33 via the barrier metal films. In other words, the respective films 5a, 14a, and 32a may be formed at the position contacting the lower faces of the effective wirings 8, 17, and 35 of the respective layers via the barrier metal film. Even in the case that they are formed at such a position, the respective films 5a, 14a, and 32a can function as the reinforcement layer as in the above-described first and second embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    at least two layers of interlayer-insulator-films stacked above a substrate and at least partially formed by a low-relative-dielectric-constant-film having a relative-dielectric-constant of 3.4 or less respectively;
    a plurality of wirings provided, wherein at least one wiring is within each of the interlayer-insulator-film and at least partially located within the low-relative-dielectric-constant-films;
    a plurality of plugs provided, wherein at least one plug is within each of the interlayer-insulator-film and connected to a lower part of the wirings; and
    a plurality of reinforcement members provided, wherein at least one reinforcement member is within each of the interlayer-insulator-film while being separated from the wirings at a predetermined interval, electrically cut from the wirings and the plugs, and at least partially located within the low-relative-dielectric-constant-films; and wherein,
    for each of the reinforcement member, a value obtained by dividing an area of a part that is exposed on an upper face of each of the interlayer-insulator-film by a length of a part contacting each of the interlayer-insulator-film of the part that is exposed on the upper face of each of the interlayer-insulator-film is defined to be S;
    a Young's modulus of a respective layer on which the plug is provided among the interlayer-insulator-films is defined to be $E_P$;
    a Young's modulus of a respective layer on which the wiring is provided among the interlayer-insulator-films is defined to be $E_W$;
    a Young's modulus of the wirings is defined to be $E_M$;
    a film thickness of a respective layer on which the plug is provided among the interlayer-insulator-films is defined to be $d_P$;
    a film thickness of a respective layer on which the wiring is provided among the interlayer-insulator-films are defined to be $d_W$;
    a coverage of the reinforcement member per unit area in an area in the interlayer-insulator-films where the reinforcement members are provided is defined to be R; and
    the S, the Ep, the $E_W$, the $E_M$, the $d_P$, the $d_W$, and the R satisfy a relation shown in the following formula for each of the interlayer-insulator-film:

$$0.025 \times \left( \frac{E_P \times d_P + (E_W \times (1-R) + E_M \times R) \times d_W}{d_P + d_W} \right)^{0.4} <$$
$$S < 0.0625 \times \left( \frac{E_P \times d_P + (E_W \times (1-R) + E_M \times R) \times d_W}{d_P + d_W} \right)^{0.4}.$$

2. The device according to claim 1, wherein the S, the $E_P$, the $E_W$, the $E_M$, the $d_P$, the $d_W$, and the R satisfy a relation shown in the following formula for each of the interlayer-insulator-film:

$$0.03 \times \left( \frac{E_P \times d_P + (E_W \times (1-R) + E_M \times R) \times d_W}{d_P + d_W} \right)^{0.4} <$$
$$S < 0.05 \times \left( \frac{E_P \times d_P + (E_W \times (1-R) + E_M \times R) \times d_W}{d_P + d_W} \right)^{0.4}.$$

3. The device according to claim 1, wherein at least one layer of the layers on which the plugs are provided and the layers on which the wirings are provided of the interlayer-insulator-films, comprises a stacking film of at least two layers of insulator films;

a Young's modulus of an i-th insulator film from top or bottom of this stacking film is defined to be $E_i$;

a film thickness of the i-th insulator film is defined to be $d_i$;

a complex Young's modulus that is a Young's modulus of the entire stacking film is defined to be $E_C$;

a total film thickness of the entire stacking film is defined to be $d_T$;

the $E_i$, the $d_i$, the $E_C$, and the $d_T$ satisfy a relation shown in the following formulas;

$$E_C = \frac{\sum_i E_i d_i}{\sum_i d_i}$$

(i: Natural number not less than 1)

$$d_T = \sum_i d_i$$

(i: Natural number not less than 1)

a Young's modulus of the entire layer formed by the stacking film among the Young's modulus $E_P$ of the layers where the plugs are provided and the Young's modulus $E_W$ of the layers where the wirings are provided is defined to be the complex Young's modulus $E_C$; and a film thickness of the entire layer formed by the stacking film among the film thickness $d_P$ of the layers where the plugs are provided and a film thickness $d_W$ of the layers where the wirings are provided is defined to be the total film thickness $d_T$.

4. The device according to claim 1, wherein the coverage R of at least one layer among the interlayer-insulator-films is different from the coverage R of other layer.

5. The device according to claim 1, wherein the shape of the reinforcement member of at least one layer among the interlayer-insulator-films are different from the shape of the reinforcement member of other layer.

6. The device according to claim 1, wherein the reinforcement members are provided to be located at the same height as the wirings, at least partially contacting the low-relative-dielectric-constant-films within the interlayer-insulator-films.

7. The device according to claim 1, wherein the reinforcement member is provided inside of each of the interlayer-insulator-film with being separated from the wiring by at least 2 μm.

8. The device according to claim 1, wherein a plurality of the reinforcement members are provided surrounding the periphery of the wiring inside of each of the interlayer-insulator-film.

9. The device according to claim 8, wherein a closest interval between a region provided with the plurality of the reinforcement members and the wiring inside of each of the interlayer-insulator-film is 250 μm or less.

10. The device according to claim 8, wherein the plurality of the reinforcement members are arranged regularly inside of each of the interlayer-insulator-film.

11. The device according to claim 1, wherein the reinforcement members are formed so that a planar shape thereof is any of a square shape, a rectangular shape, a crisscross shape, a L-shape, a key-shape, a T-shape, a mesh-like shape, a comb-like shape, a shelf-like shape, and a fence-like shape.

12. The device according to claim 1, wherein each of the interlayer-insulator-film comprises a stacking film of at least one layer of the low-relative-dielectric-constant-film and at least one layer of an insulator film having a relative-dielectric-constant more than 3.4.

13. The device according to claim 12, wherein the plugs are provided with being partially contacted the insulator films having a relative-dielectric-constant more than 3.4 at least inside of the interlayer-insulator-films.

14. The device according to claim 1, further comprising:

at least one layer of other interlayer-insulator-film, entirely formed by an insulator film having a relative-dielectric-constant more than 3.4 and stacked continuously on the interlayer-insulator-film of the upper layer among the interlayer-insulator-films;

at least one other wiring provided within the other interlayer-insulator-film;

at least one other plug provided in the other interlayer-insulator-film with being connected to the lower part of the other wiring; and at least one other reinforcement member provided in the other interlayer-insulator-film with being separated from the other wiring at a predetermined interval, and electrically cut from the other wiring and the other plug; and wherein for the other reinforcement member, a value obtained by dividing an area of a part that is exposed on an upper face of the other interlayer-insulator-film by a length of a part contacting the other interlayer-insulator-film of the part that is exposed on the upper face of the other interlayer-insulator-film is defined to be S;

a Young's modulus of a layer on which the other plug is provided among the other interlayer-insulator-film is defined to be $E_P$;

a Young's modulus of a layer on which the other wiring is provided among the other interlayer-insulator-film is defined to be $E_W$;

a Young's modulus of the other wiring is defined to be $E_M$;

a film thickness of a layer on which the other plug is provided among the other interlayer-insulator-film is defined to be $d_P$;

a film thickness of a layer on which the other wiring is provided among the other interlayer-insulator-films is defined to be $d_W$;

a coverage of the other reinforcement member per unit area in an area in the other interlayer-insulator-film where the other reinforcement member is provided is defined to be R; and the S, the $E_P$, the $E_W$, the $E_M$, the $d_P$, the $d_W$, and the R satisfy a relation shown in the following formula for the other interlayer-insulator-film:

$$0.025 \times \left( \frac{E_P \times d_P + (E_W \times (1-R) + E_M \times R) \times d_W}{d_P + d_W} \right)^{0.4} < S < 0.0625 \times \left( \frac{E_P \times d_P + (E_W \times (1-R) + E_M \times R) \times d_W}{d_P + d_W} \right)^{0.4}.$$

15. The device according to claim 14, wherein the S, the $E_P$, the $E_W$, the $E_M$, the $d_P$, the $d_W$, and the R satisfy a relation shown in the following formula for the other interlayer-insulator-film:

$$0.03 \times \left( \frac{E_P \times d_P + (E_W \times (1-R) + E_M \times R) \times d_W}{d_P + d_W} \right)^{0.4} < S < 0.05 \times \left( \frac{E_P \times d_P + (E_W \times (1-R) + E_M \times R) \times d_W}{d_P + d_W} \right)^{0.4}.$$

16. The device according to claim 14, wherein at least one layer of the layer on which the other plug is provided and the layer on which the other wiring is provided in the other interlayer-insulator-film comprises a stacking film of at least two layers of insulator films;

a Young's modulus of an i-th insulator film from top or bottom of said stacking film is defined to be $E_i$;

the film thickness of the i-th insulator film is defined to be $d_i$;

a complex Young's modulus that is a Young's modulus of the entire stacking film is defined to be $E_C$;

a total film thickness of the entire stacking film is defined to be $d_T$;

the $E_i$, the $d_i$, the $E_C$, and the $d_T$ satisfy a relation shown in the following formulas;

$$E_C = \frac{\sum_i E_i d_i}{\sum_i d_i}$$

(i: Natural number not less than 1)

$$d_T = \sum_i d_i$$

(i: Natural number not less than 1)

a Young's modulus of the entire layer formed by the stacking film among the Young's modulus $E_P$ of the layer where the other plug is provided and a Young's modulus $E_W$ of the layer where the other wiring is provided is defined to be the complex Young's modulus $E_C$; and a film thickness of the entire layer formed by the stacking film among the film thickness $d_P$ of the layer where the other plug is provided and a film thickness $d_W$ of the layer where the other wiring is provided is defined to be the total film thickness $d_T$.

17. The device according to claim 14, wherein the other reinforcement member is provided to be located at the same height as the other wiring within the other interlayer-insulator-film.

18. The device according to claim 14, wherein the other reinforcement member is provided inside of the other interlayer-insulator-film with being separated from said other wiring by at least 2 μm.

19. The device according to claim 14, wherein a plurality of the other reinforcement members are provided surrounding the periphery of the other wiring inside of the other interlayer-insulator-film.

20. The device according to claim 14, wherein the other reinforcement member is formed so that a planar shape thereof is any of a square shape, a rectangular shape, a crisscross shape, a L-shape, a key-shape, a T-shape, a mesh-like shape, a comb-like shape, a shelf-like shape, and a fence-like shape.

* * * * *

UNITED STATES PATENT AND TRADEMARK OFFICE
CERTIFICATE OF CORRECTION

PATENT NO. : 7,872,353 B2
APPLICATION NO. : 11/964336
DATED : January 18, 2011
INVENTOR(S) : Ito et al.

It is certified that error appears in the above-identified patent and that said Letters Patent is hereby corrected as shown below:

Title Page, Item (57), in the Abstract, line 6, change "interlayer-insulator-film" to --interlayer-insulator-films--.

Title Page, Item (57), in the Abstract, lines 8-9, change "interlayer-insulator-film" to --interlayer-insulator-films--.

Title Page, Item (57), in the Abstract, line 11, change "interlayer-insulator-film" to --interlayer-insulator-films--.

Title Page, Item (57), in the Abstract, line 17, change "interlayer-insulator-film." to --interlayer-insulator-films.--.

Claim 1, column 34, line 28, change "interlayer-insulator-film" to --interlayer-insulator-films--.

Claim 1, column 34, line 32, change "interlayer-insulator-film" to --interlayer-insulator-films--.

Claim 1, column 34, line 37, change "interlayer-insulator-film" to --interlayer-insulator-films--.

Claim 1, column 34, line 42, change "reinforcement member," to --reinforcement members,--.

Claim 1, column 34, line 44, change "interlayer-insulator-film" to --interlayer-insulator-films--.

Claim 1, column 34, line 45, change "interlayer-insulator-film" to --interlayer-insulator-films--.

Signed and Sealed this
Third Day of May, 2011

David J. Kappos
*Director of the United States Patent and Trademark Office*

Claim 1, column 34, line 47, change "interlayer-insulator-film" to --interlayer-insulator-films--.

Claim 1, column 34, lines 60-61, change "are defined" to --is defined--.

* Claim 1, column 34, line 65, change "the Ep," to --the $E_P$,--.

Claim 1, column 34, line 67, change "interlayer-insulator-film:" to --interlayer-insulator-films:--.

Claim 2, column 35, line 12, change "interlayer-insulator-film:" to --interlayer-insulator-films:--.

Claim 3, column 35, line 36, change "formulas" to --formulas:--.

Claim 5, column 36, line 3, change "are different" to --is different--.

Claim 7, column 36, line 12, change "interlayer-insulator-film" to --interlayer-insulator-films--.

Claim 8, column 36, line 17, change "interlayer-insulator-film." to --interlayer-insulator-films.--.

Claim 9, column 36, line 21, change "interlayer-insulator-film" to --interlayer-insulator-films--.

Claim 10, column 36, line 25, change "interlayer-insulator-film." to --interlayer-insulator-films.--.

Claim 11, column 36, line 29, change "a L-shape," to --an L-shape,--.

Claim 12, column 36, line 33, change "interlayer-insulator-film" to --interlayer-insulator-films--.

Claim 13, column 36, line 39, after "partially contacted", insert --with--.

Claim 16, column 38, line 2, change "formulas;" to --formulas:--.

Claim 20, column 38, line 45, change "a L-shape," to --an L-shape,--.